United States Patent
Chen et al.

(10) Patent No.: US 10,270,436 B2
(45) Date of Patent: Apr. 23, 2019

(54) TRANSISTORS HAVING ON-CHIP INTEGRATED PHOTON SOURCE OR PHOTONIC-OHMIC DRAIN TO FACILITATE DE-TRAPPING ELECTRONS TRAPPED IN DEEP TRAPS OF TRANSISTORS

(71) Applicant: The Hong Kong University of Science and Technology, Kowloon, Hong Kong (CN)

(72) Inventors: Jing Chen, Hong Kong (CN); Baikui Li, Hong Kong (CN); Xi Tang, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 11 days.

(21) Appl. No.: 15/526,744

(22) PCT Filed: Nov. 13, 2015

(86) PCT No.: PCT/CN2015/094518
§ 371 (c)(1),
(2) Date: May 12, 2017

(87) PCT Pub. No.: WO2016/074642
PCT Pub. Date: May 19, 2016

(65) Prior Publication Data
US 2017/0338810 A1  Nov. 23, 2017

Related U.S. Application Data

(60) Provisional application No. 62/230,998, filed on Jun. 22, 2015, provisional application No. 62/123,325, filed on Nov. 14, 2014.

(51) Int. Cl.
*H01L 27/15* (2006.01)
*H01L 29/06* (2006.01)
(Continued)

(52) U.S. Cl.
CPC .......... *H03K 17/063* (2013.01); *H01L 27/15* (2013.01); *H01L 29/1033* (2013.01);
(Continued)

(58) Field of Classification Search
CPC ......... H01L 27/00; H01L 27/15; H01L 29/00; H01L 29/0657; H01L 29/1033;
(Continued)

(56) References Cited

U.S. PATENT DOCUMENTS 4,774,205 A    9/1988  Choi et al.
5,739,561 A *  4/1998  Wennekers ............ B82Y 20/00
                                                           257/257
(Continued)

FOREIGN PATENT DOCUMENTS

CN    101393958 A    3/2009
CN    101442092 A    5/2009
(Continued)

OTHER PUBLICATIONS

Milan Tapajna, Jose L. Jimenez, and Martin Kuball (2012). On the discrimination between bulk and surface traps in AlGaN/GaN HEMTs from trapping characteristics. Phys. Status Solidi, A 209 (No. 2), pp. 386-389.*
(Continued)

*Primary Examiner* — Lincoln D Donovan
*Assistant Examiner* — Dave Mattison
(74) *Attorney, Agent, or Firm* — Amin, Turocy & Watson, LLP

(57) ABSTRACT

Techniques are provided that pumping of deep traps in GaN electronic devices using photons from an on-chip photon source. In various embodiments, a method for optical pumping of deep traps in GaN HEMTs is provided using an on-chip integrated photon source that is configured to generate photons during operation of the HEMT. In an aspect,
(Continued)

the on-chip photon source is a SoH-LED. In various additional embodiments, an integration scheme is provided that integrates the photon source into the drain electrode of a HEMT, thereby converting the conventional HEMT with an ohmic drain to a transistor with hybrid photonic-ohmic drain (POD), a POD transistor or PODFET for short.

28 Claims, 26 Drawing Sheets

(51) Int. Cl.

| | | |
|---|---|---|
| H01L 29/10 | (2006.01) | |
| H01L 29/20 | (2006.01) | |
| H01L 33/00 | (2010.01) | |
| H01L 33/32 | (2010.01) | |
| H01L 33/36 | (2010.01) | |
| H03K 17/06 | (2006.01) | |
| H01L 29/205 | (2006.01) | |
| H01L 29/207 | (2006.01) | |
| H01L 29/417 | (2006.01) | |
| H01L 29/778 | (2006.01) | |

(52) U.S. Cl.
CPC ........ *H01L 29/2003* (2013.01); *H01L 29/205* (2013.01); *H01L 29/41725* (2013.01); *H01L 29/7786* (2013.01); *H01L 29/7787* (2013.01); *H01L 33/0025* (2013.01); *H01L 33/0033* (2013.01); *H01L 33/32* (2013.01); *H01L 33/36* (2013.01); *H01L 29/0657* (2013.01); *H01L 29/207* (2013.01)

(58) Field of Classification Search
CPC . H01L 29/2003; H01L 29/205; H01L 29/207; H01L 29/41725; H01L 29/7786; H01L 29/7787; H01L 33/00; H01L 33/0025; H01L 33/0033; H01L 33/32; H01L 33/36; H03K 17/00; H03K 17/04126; H03K 17/063; H03K 17/0826; H03K 17/601; H03K 2217/00; H03K 2217/0036
USPC ........................................................ 327/109
See application file for complete search history.

(56) References Cited

U.S. PATENT DOCUMENTS

| | | | |
|---|---|---|---|
| 5,866,925 A | 2/1999 | Zolper et al. | |
| 6,340,826 B1 | 1/2002 | Illiadis | |
| 7,829,882 B2 | 11/2010 | Kim et al. | |
| 7,851,284 B2 | 12/2010 | Zhang et al. | |
| 7,932,539 B2 | 4/2011 | Chen et al. | |
| 8,076,699 B2 | 12/2011 | Chen et al. | |
| 8,179,937 B2 | 5/2012 | Walter et al. | |
| 8,455,856 B1 | 6/2013 | Hersee | |
| 2009/0072267 A1 | 3/2009 | Goshonoo et al. | |
| 2013/0240832 A1* | 9/2013 | Hersee | H01L 27/15 257/13 |

FOREIGN PATENT DOCUMENTS

| | | |
|---|---|---|
| CN | 101562182 A | 10/2009 |
| CN | 104170089 A | 11/2014 |
| DE | 3709302 | 10/1988 |
| JP | S5728375 A | 2/1982 |
| JP | 2008198731 A | 8/2008 |
| JP | 2009071220 A | 4/2009 |
| KR | 940005728 B1 | 6/1994 |
| WO | 2013128410 A1 | 9/2013 |

OTHER PUBLICATIONS

International Search Report for PCT Application No. PCT/CN2015/094518, dated Feb. 18, 2016, 3 pages.
Binari et al., "Trapping Effects in GaN and SiC Microwave FETs". Proceedings of the IEEE vol. 90, No. 6 Jun. 2002. 11 pages.
Lian et al., "AlGaN/GaN HEMTs on Silicon With Hybrid Schottky-Ohmic Drain for High Breakdown Voltage and Low Leakage Current", IEEE Electron Device Letters, vol. 33, No. 7, Jul. 2012. 3 pages.
Li, et al., "Monolithic integration of light-emitting diodes and power metal-oxide-semiconductor channel high-electron-mobility transistors for light-emitting power integrated circuits in GaN on sapphire substrate". Applied Physics Letters 102, 192107 (2013), 4 pages.
Liu et al., "Selective epitaxial growth of monolithically integrated GaN-based light emitting diodes with AlGaN/GaN driving transistors". Applied Physics Letters 104, 091103 (2014), 5 pages.
Kaneko et al., "Current-collapse-free Operations up to 850 V by GaN-GIT utilizing Hole Injection from Drain". Proceedings of the 27th International Symposium Power Semiconductor Devices & IC's May 10-14, 2015, Kowloon Shangri-La, Hong Kong. 4 pages.
M. J. Wang and K. J. Chen, "Kink Effect in AlGaN/GaN HEMTs Induced by Drain and Gate Pumping" IEEE Electron Device Letters, vol. 32, No. 4, Apr. 2011. 3 pages.
Chen, et al. U.S. Appl. No. 61/966,918, filed Mar. 6, 2014, "P-doping-free Schottky-on-heterojunction light-emitting diode (soh-LED) and high electron mobility light-emitting transistor (HEM-LET)", 12 pages.
Chen, et al. U.S. Appl. No. 62/123,325, filed Nov. 14, 2014, "A method for optical pumping of deep traps in HEMTs using an on-chip light source", 9 pages.
S. Huang, S. Yang, J. Roberts, and K. J. Chen, "Threshold voltage instability in Al2O3/GaN/AlGaN/GaN metal-insulator-semiconductor high-electron mobility transistors", Japanese Journal of Applied Physics 50, 110202 (2011).
Zhou, et al. "Vertical leakage/breakdown mechanisms in AlGaN/GaN-on-Si devices",IEEE Electron Device Letters, vol. 33, No. 8, Aug. 2012, 4 pages.
M. Tapajna, J. Jimenez, and M. Kuball, "On the discrimination between bulk and surface traps in AlGaN/GaN from trapping characteristics", Physica status solidi (a) 209, 386-389 (2012).
G. Meneghesso, M. Meneghini, D. Bisi, I. Rossetto, A. Cester, U. K. Mishra, and E. Zanoni, "Trapping phenomena in AlGaN/GaN HEMTs: a study based on pulsed and transient measurements", Semiconductor Science and Technology 28, 074021 (2013). 10 pages.
Q. M. Jiang, Z. Tang, C. Zhou, S. Yang, and K. J. Chen, "Substrate-coupled cross-talk effects on an AlGaN/GaN-on-Si smart power IC platform", IEEE Transactions on Electron Devices 61, 3808-3813 (2014).
B. K. Li, X. Tang, J. N. Wang, and K. J. Chen, "P-doping-free III-nitride high electron mobility light-emitting diodes and transistors", Applied Physics Letters 105, 032105 (2014).
B. K. Li, X. Tang, and K. J. Chen. "Optical pumping of deep traps in AlGaN/GaN-on-Si HEMTs using an on-chip Schotky-on-heterojunction light-emitting diode" Applied Physics Letters, 106, 093505(Mar. 2015).
X. Tang, B. K. Li, and K. J. Chen. "On-chip optical pumping of deep traps in AlGaN/GaN-on-Si power HEMTs" 2015 International Symposium on Power Semiconductor Devices and ICs (ISPSD), Hong Kong, May 10-14, 2015.
X. Tang, B. K. Li, Y. Lu, H. Wang, C. Liu, and K. J. Chen. "III-nitride transistors with photonic-ohmic drain for enhanced dynamic performances," 2015 IEEE International Electron Device Meeting (IEDM), Washington D.C., USA, Dec. 7-9, 2015.
Seeds, A.J. "Optical control of microwave semiconductor devices" IEEE Transactions on Microwave Theory and Techniques ( vol. 38, Issue: 5, May 1990 ).
Cheney, D.J. "Trap detection in electrically stressed AlGaN/GaN HEMTs using optical pumping" Microelectronics Reliability, vol. 52, Issue 12, Dec. 2012, pp. 2884-2888.
Albrecht, H. "Pin Photodiodes and Field-Effect Transistors for Monolithically Integrated InP/InGaAs Optoelectronic Circuit", 1990, Micro System Technologies 90 pp. 767-772.

(56) References Cited

OTHER PUBLICATIONS

Li, et al. "Schottky-on-heterojunction optoelectronic functional devices realized on AlGaN/GaN-on-Si platform", Electron Devices Meeting (IEDM), 2014 IEEE International, Dec. 2014.
Wada, O. et al. "Monolithic integration of an AlGaAs/GaAs DH LED with a GaAs FET driver", IEEE Electron Device Letters ( vol. 3, Issue: 10, Oct. 1982 ).
R. Vetury, N. Q. Zhang, S. Keller, and U. K. Mishra, "The Impact of Surface States on the DC and RF Characteristics of AlGaN/GaN HFETs", IEEE Transactions on Electron Devices, vol. 48, No. 3, Mar. 2001, 7 pages.
"S. Liu, S. Yang, Z. Tang, Q. Jiang, C. Liu, M. Wang, and K. J. Chen, ""Al2O3/Aln/GaN MOS-Channel-HEMTsWith an AlN Interfacial Layer"" IEEE Electron Device Letters, vol. 35, No. 7, Jul. 2014, 3 pages."
Y. Lu, S. Yang, Q. Jiang, Z. Tang, B. K. Li, and K. J. Chen, "Characterization of VT-instability in enhancement-mode Al2O3-AlGaN/GaN MIS-HEMTs" Phys. Status Solidi C 10, No. 11, pp. 1397-1400 (2013).
P. B. Klein, S. C. Binari, K. Ikossi, A. E. Wickenden, D. D. Koleske, and R. L. Henry, "Current collapse and the role of carbon in AlGaN/GaN high electron mobility transistors grown by metalorganic vapor-phase epitaxy" Appl. Phys. Lett. 79, 3572 (2001). 4 pages.
GaNSystems "650 V E-HEMT transistors" [http://www.gansystems.com/trans-temp.php], page from Dec. 10, 2015 retrieved on Jul. 14, 2018 via the Wayback Machine [https://web.archive.org/web/20151210144603/http://www.gansystems.com/trans-temp.php], 2 pages.
Enkris Semiconductor "Enkris Semiconductor Demonstrates High Voltage GaN HEMT Structures on 200mm Silicon with AIXTRON Tool" [http://www.enkris.com/NewsView.asp?ID=87], Jul. 3, 2014, page from Aug. 21, 2015 retrieved on Jul. 14, 2018 via the Wayback Machine [https://web.archive.org/web/20150821025252/http://www.enkris.com:80/NewsView.asp?ID=87], 2 pages.
Cree "CGHV31500F" [http://www.cree.com/RF/Products/SBand-XBand-CBand/Packaged-Discrete-Transistors/CGHV31500F], page from Aug. 12, 2015 retrieved on Jul. 14, 2018 via the Wayback Machine [https://web.archive.org/web/20150812004111/http://www.cree.com/RF/Products/SBand-XBand-CBand/Packaged-Discrete-Transistors/CGHV31500F], 1 page.
NorthropGrumman "Gallium Arsenide (GaAs) HEMT Matches Technologies & Applications" [http://www.northropgrumman.com/BusinessVentures/Microelectronics/Products/Pages/Gallium-Arsenide-(GaAs)-HEMT.aspx], retrieved on Jul. 14, 2018, 1 page.
Global Communication Semiconductors "GaAs & GaN RF Technologies" [http://www.gcsincorp.com/dedicated_pure-play_wafer_foundry/GaAs & GaN RF Technologies.php], retrieved on Jul. 14, 2018, 1 page.
TriQuint "TGF2961-SD" [http://triquint.com/products/p/TGF2961-SD], retrieved on Jul. 14, 2018, 2 pages.
D. Bisi, M. Meneghini, F. A. Marino, D. Marcon, S. Stoffels, M. Van Hove, S. Decoutere, G. Meneghesso, and E. Zanoni, "Kinetics of Buffer-Related RON-Increase in GaN-on-Silicon MIS-HEMTs" IEEE Electron Device Letters, vol. 35, No. 10, Oct. 2014. 3 pages.
S. Ghosh, S. M. Dinara, P. Mukhopadhyay, S. K. Jana, A. Bag, A. Chakraborty, E. Y. Chang, S. Kabi, and D. Biswas, "Effects of threading dislocations on drain current dispersion and slow transients in unpassivated AlGaN/GaN/Si heterostructure held-effect transistors" Appl. Phys. Lett. 105, 073502 (2014). 6 pages.
G. Koley, V. Tilak, L. F. Eastman, and M. Spencer, "Slow Transients Observed in AlGaN/GaN HFETs: Effects of SiNx Passivation and UV Illumination" IEEE Transactions on Electron Devices, vol. 50, No. 4, Apr. 2003. 8 pages.
Macom "MAGX-000912-650L0x" [https://www.mouser.com/datasheet/2/249/Datasheet%20-%20MAGX-000912-650L0x-536413.pdf], retrieved Jul. 14, 2018, 10 pages.
NXP Semiconductors "Mainstream GaN" [http://www.nxp.com/products/rf/amplifiers/power_transistors/gan_devices/#description], page from Nov. 28, 2015 retrieved on Jul. 14, 2018 via the Wayback Machine [https://web.archive.org/web/20151128042200/http://www.nxp.com/products/rf/amplifiers/power_transistors/gan_devices/], 3 pages.
Prolux advanvced semiconductors "AlGaN/GaN-on-Sapphire HEMT" [http://www.pro-lux.net/?page_id=415], retrieved on Jul. 14, 2018, 2 pages.
Transphorm USA, Inc. "GaN transistors—All Products" [https://www.transphormusa.com/products], retrieved on Jul. 14, 2018, 4 pages.
VisIC Technologies "GaN Transistors" [http://www.visic-tech.com/#!investors/c1iwz], retrieved on Jul. 14, 2018, 6 pages.
Texas Instruments "LMG5200" [http://www.ti.com/product/lmg5200], retrieved on Jul. 14, 2018, 1 page.
"J. Joh, N. Tipimeni, S. Pendharkar, and S. Krishnan, ""Current Collapse in GaN Heterojunction Field EffectTransistors for High-voltage Switching Applications"" 2014 IEEE International Reliability Physics Symposium, pp. 6C.5.1-6C.5.4, Waikoloa, HI, Jun. 1-5, 2014, 4 pages."
M. J. Wang and K. J. Chen, "Improvement of the Off-State Breakdown Voltage With Fluorine Ion Implantation in AlGaN/GaN HEMTs" IEEE Transactions on Electron Devices, vol. 58, No. 2, Feb. 2011, 6 pages.
"W. Saito, Y. Takada, M. Kuraguchi, K. Tsuda, and I. Omura, ""Recessed-Gate Structure Approach Toward NormallyOff High-Voltage AlGaN/GaN HEMT for Power Electronics Applications"" IEEE Transactions on Electron Devices, vol. 53, No. 2, Feb. 2006, 7 pages."
S. Nakamura, G. Fasol, "The Blue Laser Diode—GaN Based Light Emitters and Lasers" (Springer, Berlin, 1997) 14 pages.
E. F. Schubert, "Light Emitting Diodes" (Cambridge University Press, Cambridge, UK, 2006). 41 pages.
S. Huang, Q. Jiang, S. Yang, C. Zhou, and K. J. Chen, "Effective Passivation of AlGaN/GaN HEMTsby ALD-Grown AlN Thin Film" IEEE Electron Device Letters, vol. 33, No. 4, Apr. 2012, 3 pages.
H. Wang, C. Liu, Q. Jiang, Z. Tang, and K. J. Chen, "Dynamic Performance of AlN-Passivated AlGaN/GaN MIS-High Electron Mobility Transistors Under Hard Switching Operation" IEEE Electron Device Letters, vol. 36, No. 8, Aug. 2015, 3 pages.
S. Liu, S. Yang, Z. Tang, Q. Jiang, C. Liu, M. Wang, and K. J. Chen, "Performance Enhancement of Normally-OffAl2O3/AlN/GaN MOS-Channel-HEMTs with an ALDGrown AlN Interfacial Layer" Proceedings of the 26th International Symposium on Power Semiconductor Devices & IC's Jun. 15-19, 2014 Waikoloa, Hawaii, 4 pages.
VisIC Technologies "All-Switch—List of Products" [http://visic-tech.com/products/list-of-products/], retrieved Jul. 14, 2018, 7 pages.

* cited by examiner

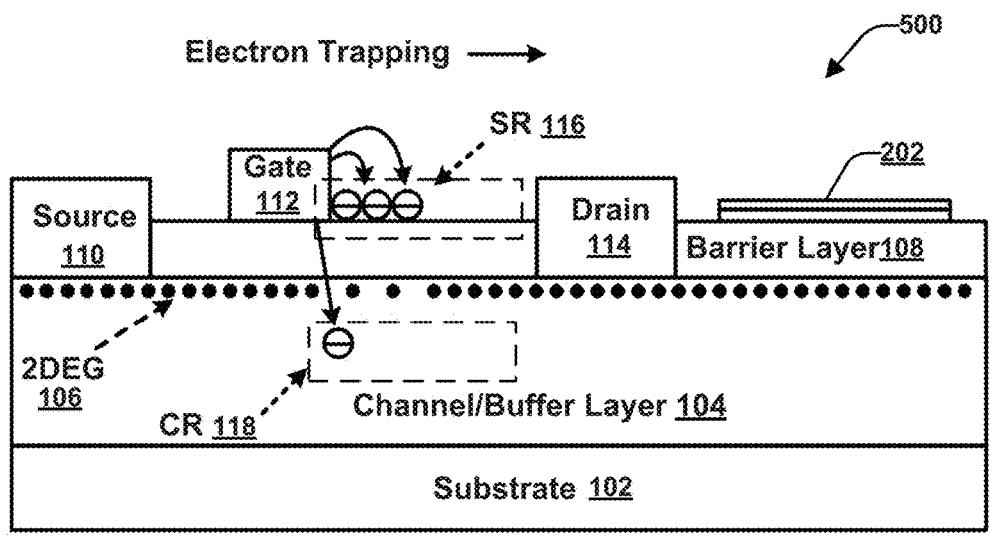
FIG. 5     ⊖ = trapped electron
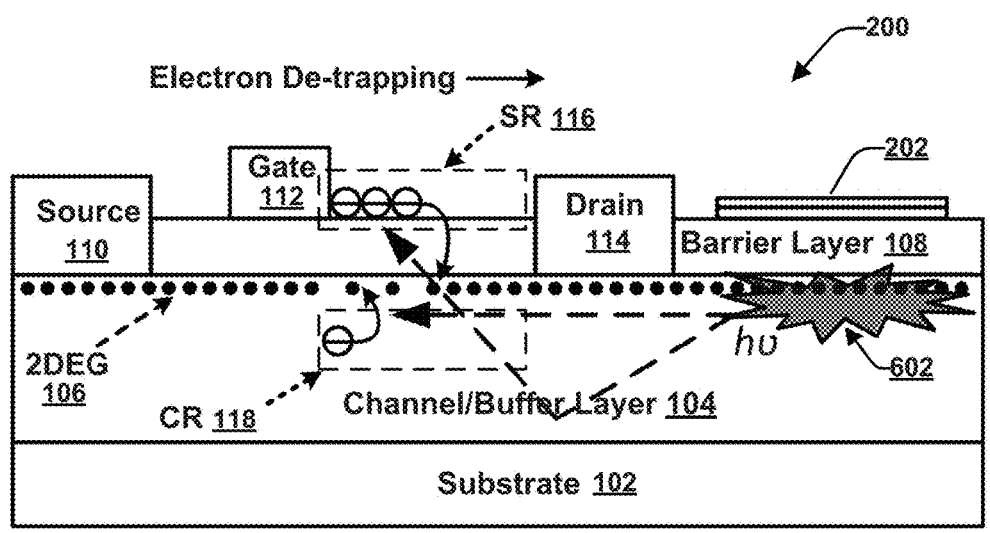
FIG. 6     ⊖ = trapped electron
          602 = photon generation Electron Trapping into
Surface Traps

Electron De-trapping from Surface Traps

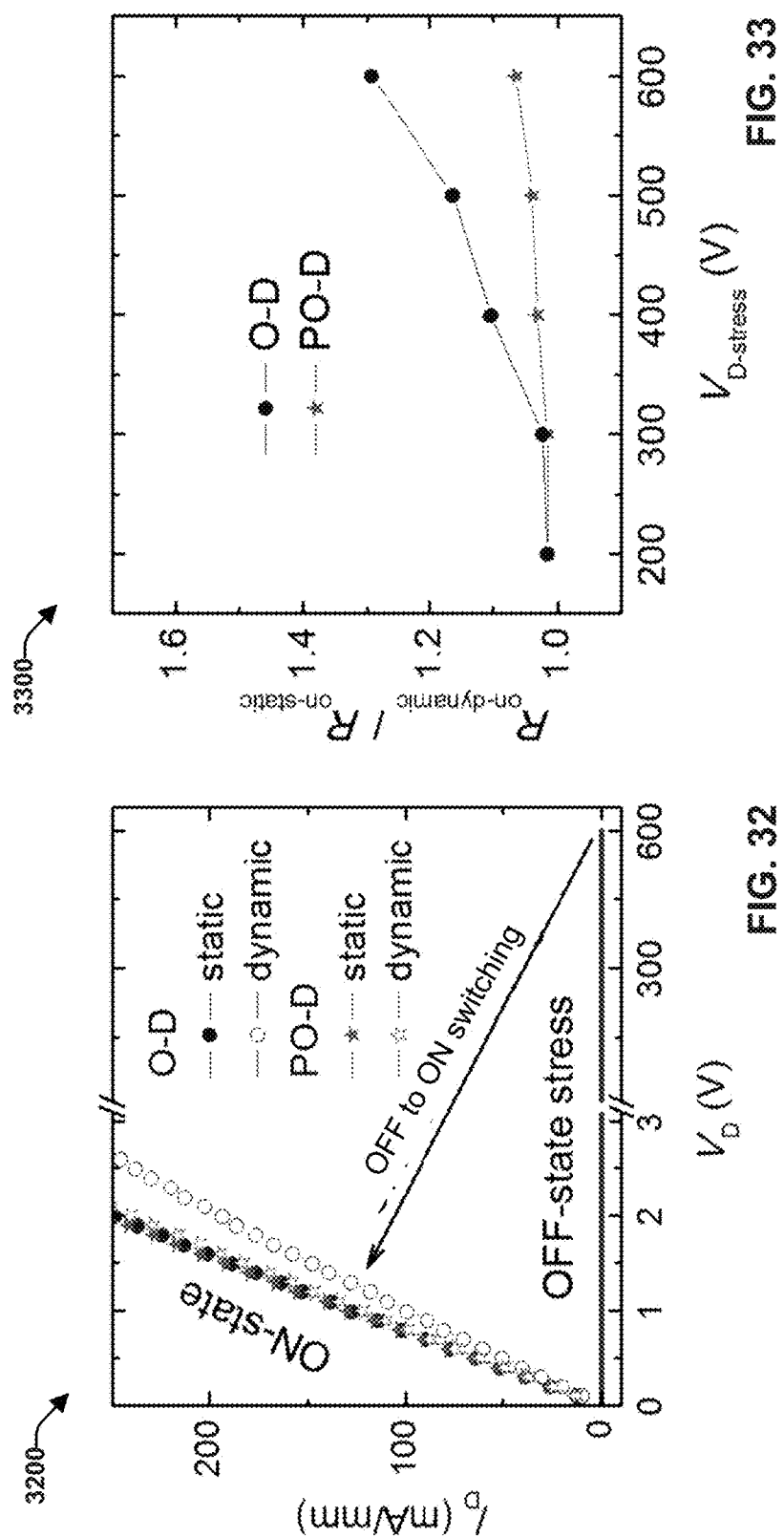

TRANSISTORS HAVING ON-CHIP INTEGRATED PHOTON SOURCE OR PHOTONIC-OHMIC DRAIN TO FACILITATE DE-TRAPPING ELECTRONS TRAPPED IN DEEP TRAPS OF TRANSISTORS

RELATED APPLICATION

This application is a U.S. National Stage filing under 35 U.S.C. § 371 of international patent cooperation treaty (PCT) application No. PCT/CN2015/094518, filed Nov. 13, 2015, and entitled "TRANSISTORS HAVING ON-CHIP INTEGRARED PHOTON SOURCE OR PHOTONIC-OHMIC DRAIN TO FACILIATE DE-TRAPPING ELECTRONS TRAPPED IN DEEP TRAPS OF TRANSISTORS", which claims priority to U.S. Provisional Patent Application No. 62/123,325, filed on Nov. 14, 2014, and entitled "METHOD FOR OPTICAL PUMPING OF DEEP TRAPS IN HEMTS USING AN ON-CHIP LIGHT SOURCE," and U.S. Provisional Patent Application No. 62/230,998, filed on Jun. 22, 2015, and entitled "TRANSISTORS WITH PHOTONIC-OHMIC DRAIN (POD TRANSISTOR, PODFET)". The entireties of the aforementioned applications are hereby incorporated by reference herein.

TECHNICAL FIELD

This disclosure relates generally to methods for de-trapping electrons from deep traps in high-electron-mobility transistors (HEMTs) using photons from an on-chip photon source or a photonic-ohmic drain of the transistor.

BACKGROUND

Carrier traps are inevitable in gallium nitride (GaN) on silicon (Si) heterostructure devices. When used for high-voltage power switching applications, carriers can be trapped in regions located at the surface of semiconductors, the interface between dielectrics and semiconductors, and the bulk of semiconductors, as the electric field therein increases, and then start to de-trap as the electric field decreases. These regions are referred to herein as surface traps and bulk traps, respectively. They are considered 'deep' traps in the sense that the energy required to de-trap an electron or hole from the trap to the conduction or valence is much larger than the characteristic thermal energy kT, where k is the Boltzmann constant and T is temperature. For example, dangling bonds or native oxide at the surface of gallium nitride or aluminum gallium nitride can lead to the formation of surface traps, while defects/dislocations or compensate doping (e.g. carbon doping), which is essential for achieving high blocking voltage, may act as bulk traps.

The carrier trapping and de-trapping processes induce additional switching or conduction losses when the devices fabricated on the semiconductor platform undergo dynamic operations, leading to large power losses and significant device instability. For example, when the de-trapping speed of the electrons is slower than the switching speed of the devices (which occurs for deep traps), the trapped electrons can degrade dynamic performances of the devices, leading to adverse effects such as instability of threshold voltage ($V_{th}$) and increase of dynamic on-resistance $R_{on}$, a phenomenon referred to as 'current collapse.' Full exploitation of the superior material properties of III-nitride semiconductors is thus hindered by electron/hole traps which are inevitable in state-of-the-art epitaxial samples. Accordingly, the performance of high electron mobility transistors (HEMT) based on III-nitride semiconductor heterostructures with a Schottky gate or metal-insulator-semiconductor (MIS) gate or metal-oxide-semiconductor (MOS) gate for high-power radio-frequency (RF)/microwave electronics and/or high-voltage power electronics could be dramatically enhanced when the effects of deep traps can be suppressed or eliminated.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 5 presents a schematic cross section of a HEMT device illustrating electron trapping into surface traps and bulk traps induced by OFF-state high drain bias in accordance with various aspects and embodiments described herein.

FIG. 6 presents another schematic cross section of HEMT device illustrating de-trapping of electrons from deep traps assisted by the photons generated from an on-chip integrated SoH-LED.

FIGS. 9-10 provide the voltage sequences applied to the integrated HEMT and SoH-LED during OFF-state high drain stress and the subsequent recovering, as well as the measured drain current recovery curves with and without SoH-LED ON.

FIG. 27 presents a cross-sectional view of another example PODFET in accordance with various additional aspects and embodiments described herein.

FIGS. 32-33 provides graphs depicting the measurement sequence of OFF-state stress and the subsequent OFF to ON switching (soft-switching) characteristics of a PODFET and a conventional MIS-HEMT with an ohmic drain to evaluate the dynamic on-resistance, and dynamic on-resistance degradation up to 600 V.

DETAILED DESCRIPTION

Figure 1:
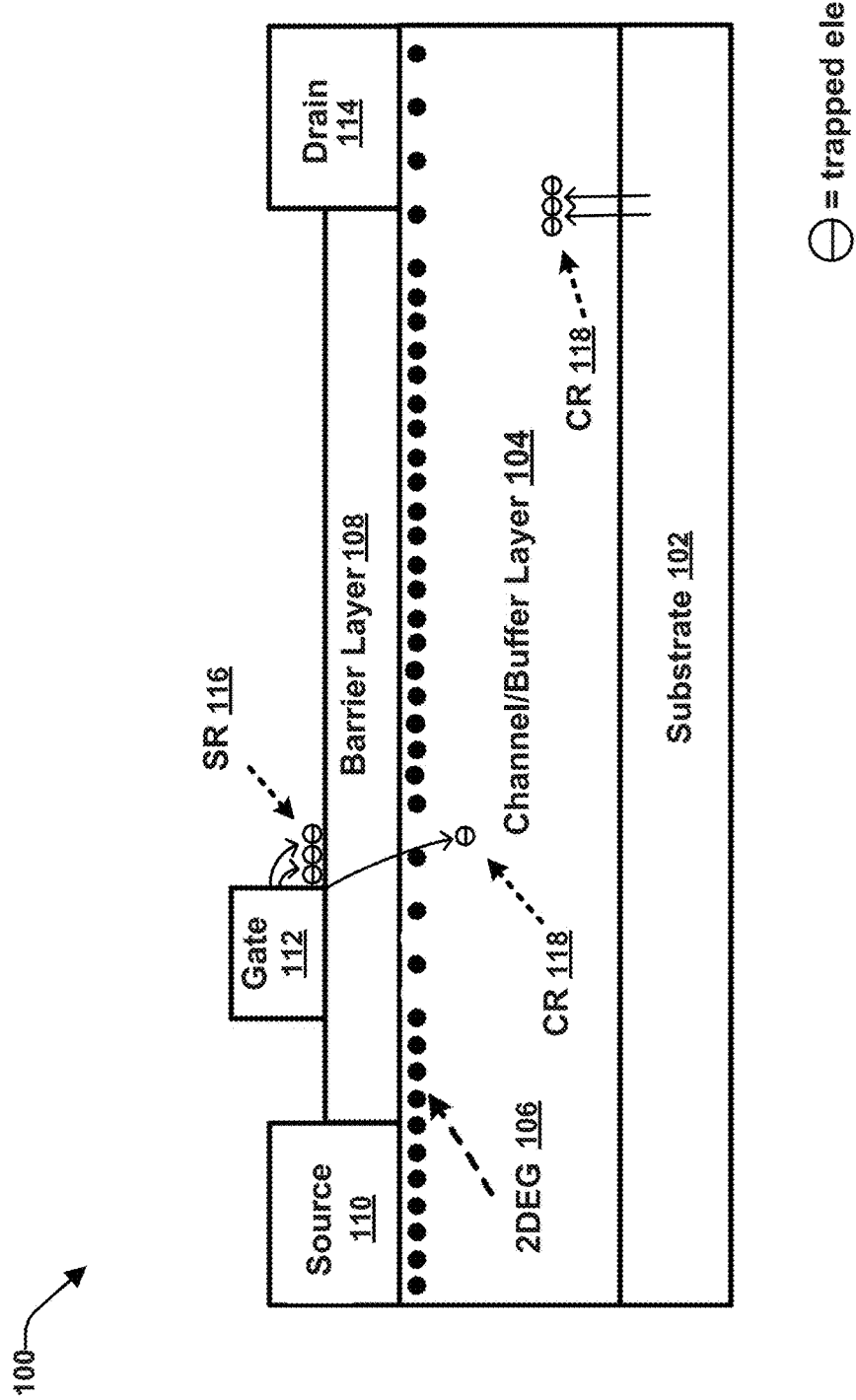
FIG. 1 presents a schematic cross section of a HEMT in an OFF-state in accordance with various aspects and embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

By way of introduction, the subject matter disclosed herein relates to transistors having an on-chip integrated photon source or a photonic-ohmic drain to facilitate de-trapping electrons from deep traps of the transistors to minimize influences the of deep traps during dynamic device operation. The term "dynamic" device operation refers to switching of a transistor ON and OFF at a high frequency. In various embodiments, methods are provided that use on-chip photons to accelerate electron de-trapping for improving the dynamic performance of GaN-based lateral heterojunction power devices (e.g., HEMTs). In an aspect, the on-chip photon source includes a Schottky-on-heterojunction light emitting diode (SoH-LED). The de-trapping of electrons from both surface traps and bulk traps can be effectively assisted by the on-chip SoH-LED photons, demonstrated by the accelerated recovery processes of $R_{on}$ (ON-resistance) and $V_{th}$ (threshold voltage) in an AlGaN/GaN HEMT.

In other embodiments, techniques for minimizing the impact of deep traps are provided that seamlessly integrate a photon source into the drain terminal of a lateral GaN heterojunction power transistor. The photon source can be synchronously turned on when the power transistor goes through a high-current ON state. The photonic drain and ohmic drain together forms a hybrid photonic-ohmic drain (POD), referred to herein as POD transistor or a POD field effect transistor (PODFET).

The POD consists of a photon generation region (photonic drain) and an ohmic region (ohmic drain). The ohmic drain is electrically connected to the transistor channel. The anode of the photonic drain is electrically shorted with the ohmic drain, while the cathode of the photonic drain is served by the channel beneath the anode of the photonic drain. The effective bias across the anode and cathode of the photonic region is generated spontaneously by the inherent channel current and the inherent resistance which consists of the channel resistance between the photonic drain and ohmic drain and the contact resistance of the ohmic drain.

The photon generation in PODFET is switched ON/OFF simultaneously with the channel current. Therefore, the PODFET is a compact structure that can realize the functionality of self-photon generation and photon pumping of deep traps in synchronous mode with the channel current during power switching, consequently eliminating any peripheral control circuit.

With reference now to the drawings, FIG. 1 presents a schematic cross section of a HEMT 100 showing the electron traps locating at the gate edge of barrier surface, channel/buffer layer in the access region, buffer layer beneath the drain terminal. HEMT 100 includes a substrate 102 having a heterostructure formed thereon that includes a first semiconductor material as a channel/buffer layer 104 and a second semiconductor material as a barrier layer 108. The channel/buffer layer 104 is formed on and adjacent to the substrate and the barrier layer 108 is formed on and adjacent to the channel/buffer layer 104. The channel layer 104 includes a semiconductor material having a first energy bandgap and the barrier layer 108 includes a semiconductor material having a second energy bandgap larger than the first energy bandgap.

In various embodiments, the semiconductor materials employed for the channel/buffer layer 104 and the barrier layer 108 are III-nitrides (e.g., GaN, AlGaN, InAlN, etc.). In an exemplary embodiment, the channel/buffer layer 104 includes GaN (e.g., having a bandgap of about 3.4 eV) and the barrier layer includes AlGaN (e.g., having a bandgap from about 3.4 eV to about 6.1 eV). The material of the substrate 102 can vary. In an aspect, substrate 102 includes silicon. Other suitable substrate 102 materials can include but are not limited to, sapphire ($Al_2O_3$) and silicon carbide (SiC).

The heterostructure further includes a 2DEG channel 106 formed at the interface between the channel layer 104 and the barrier layer 108 (referred to herein as the "heterointerface") due to the contrast in the polarization of the two materials employed for the channel layer 104 and the barrier layer 108. In an aspect, the 2DEG 106 has density at the heterointerface of about $10^{13}$ cm$^{-2}$ and a carrier mobility of about 2000 cm$^2$V$^{-1}$s$^{-1}$ at room temperature. In various implementations, the semiconductor materials of the channel layer 104 and the barrier layer 108 are p-doping free. As a result, the electric current travels along the high-density 2DEG channel induced by strong spontaneous and piezoelectric polarization effects with no pn junctions.

HEMT 100 further includes a source electrode 110 formed on and adjacent to the channel layer 104, a drain electrode 114 formed on an adjacent to the 2DEG channel 106 and a gate electrode 112 formed on and adjacent to the barrier layer 108 and between the source electrode 110 and the drain electrode 114. In various implementations, the gate electrode 112 is a Schottky-gate. The gate electrode 114 can include a metal-insulator-semiconductor (MIS) gate or metal-oxide-semiconductor (MOS) gate.

When the HEMT 100 is switched to an OFF-state with high drain bias, electrons can be injected into surface or interface region 116 near the gate electrode (also referred to herein as surface traps), and/or into a channel region 118 within the channel/buffer layer and below the 2DEG channel 106 (also referred to herein as channel traps or bulk traps), or injected from the substrate and trapped by the deep traps in the buffer layer with an even higher drain bias. De-trapping of electrons from deep traps is very slow, due to the fact that the electron thermal energy is much smaller than the energy barrier that need to be overcome for trapped electrons to escape. When the HEMT 100 is switched on again, the trapped electrons cannot be released immediately, and will partially deplete the 2DEG channel 106 in the access region between the gate electrode and the drain electrode. This will leads to an increase of on-resistance $R_{on}$, and consequently result in larger power losses during dynamic operations.

Figure 2:
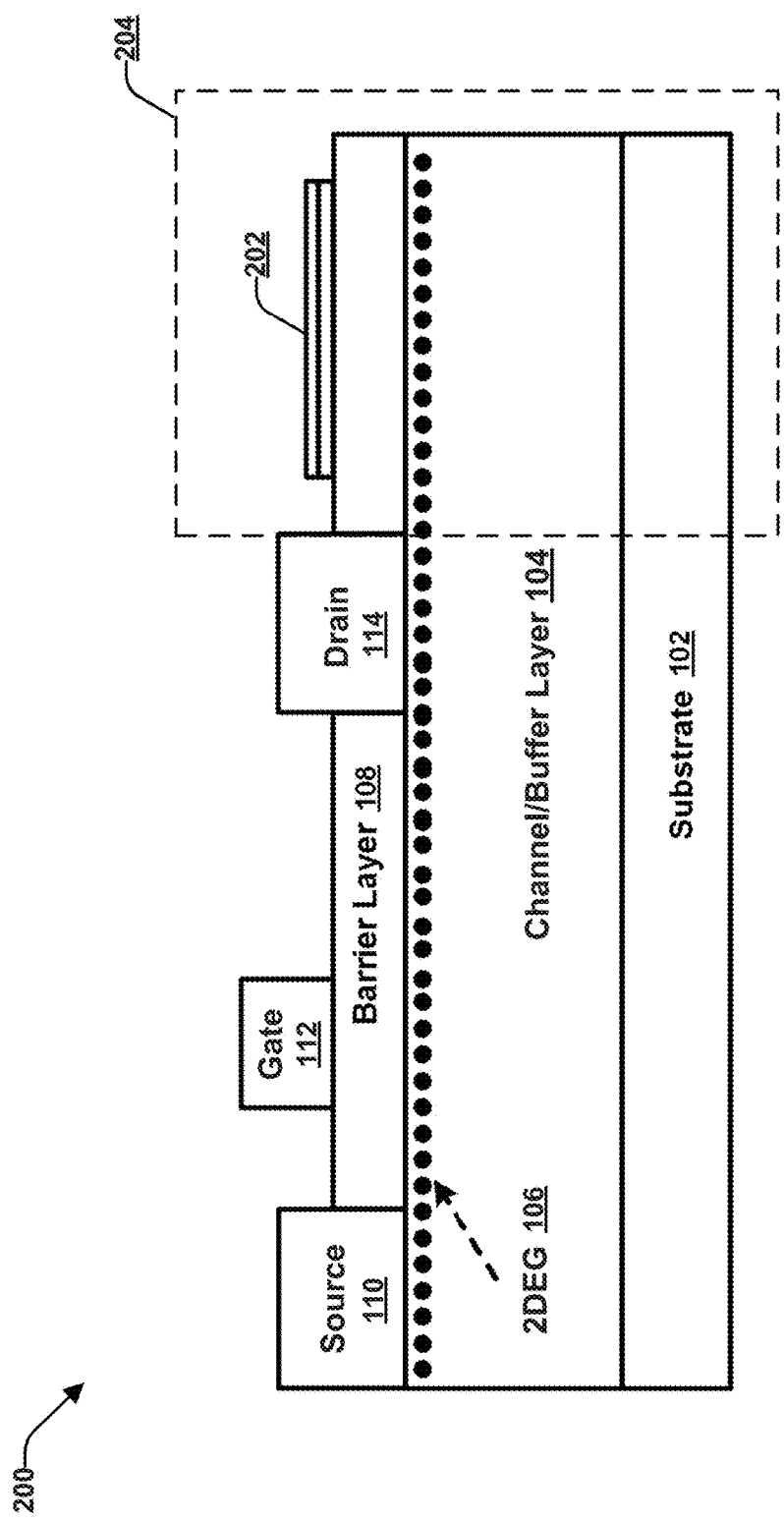
FIG. 2 presents a schematic cross section of an integrated HEMT device having an on-chip photon source in accordance with one or more embodiments described herein.

FIG. 2 presents a schematic cross section of an integrated HEMT device 200 with an on-chip integrated photon source in accordance with one or more embodiments described herein. Device 200, includes same or similar structures, features, and functionality as device 100 with the addition of the on-chip photon source 202. Repetitive description of like elements employed in other embodiments described herein is omitted for sake of brevity.

Integrated HEMT device 200 includes an on-chip photon source 202. The term 'on-chip' is used herein to refer to the formation of a device component on a substrate 102 or chip. The photon source 202 is referred to as an on-chip photon source because the photon source 202 is formed on the same substrate 102 employed by the HEMT.

Photon source 202 is configured to generate photons during operation of the integrated HEMT device 200 (e.g., when the integrated HEMT device 200 is in an ON-state) to facilitate de-trapping of electrons trapped in deep traps of the HEMT (e.g., surface region 116 traps and channel region 118 traps). Because typical HEMT structures do not have pn junctions they are considered incapable of generating photons in an efficient way. Light illumination via an off-chip light source has been found to effectively assist the electron de-trapping process and suppress the current collapse in AlGaN/GaN HEMTs. However, metal electrodes and interconnects in the finished devices block photons from the active device region when the light source is directed toward the HEMT from the topside (e.g., the side opposite from the substrate 102). In addition, for AlGaN/GaN-on-Si structure which is the dominant platform for the on-going intensive development of GaN-based power electronics, light illumination from backside is neither possible through the opaque Si substrate.

Integrated HEMT device 200 monolithically integrates an HEMT (e.g., HEMT 100) with an adjacent photon source 202. By monolithically integrating an HEMT with an adjacent photon source 202, photons can be generated on-chip and reach both the surface region and the bulk regions directly without being blocked by metal electrodes or the Si substrate. Meanwhile, the on-chip photon source provides a highly efficient and more compact system owing to the greatly reduced parasitics. Thus, the on-chip photon pumping is more efficient in suppressing the effects of traps during the dynamic device operation. In particular, photons generated by photon source 202 can accelerate electron de-trapping in the HEMT when the HEMT is switched from an OFF-state to an ON-state, thereby minimizing the influences of traps during dynamic device operation. The photons effectively assist the de-trapping of electrons from both surface traps and bulk traps, demonstrated by the accelerated recovery processes of $R_{on}$ and $V_{th}$ in an AlGaN/GaN HEMT.

In an exemplary embodiment, the photon source 202 includes a SoH-LED. According to this embodiment, the SoH-LED includes the portion of integrated HEMT device 200 included in the area of dashed box 204. The SoH-LED can be seamlessly integrated into the HEMT platform to provide an on-chip photon source. When integrated onto the same chip/substrate as an HEMT, the integrated SoH-LED can employ the same substrate 102, channel layer 104/barrier layer 108 heterostructure, and 2DEG channel 106 of the HEMT. The EL spectrum of the SoH-LED consists of a yellow band, a blue band, and also a narrow GaN band-edge UV emission.

Figure 3:
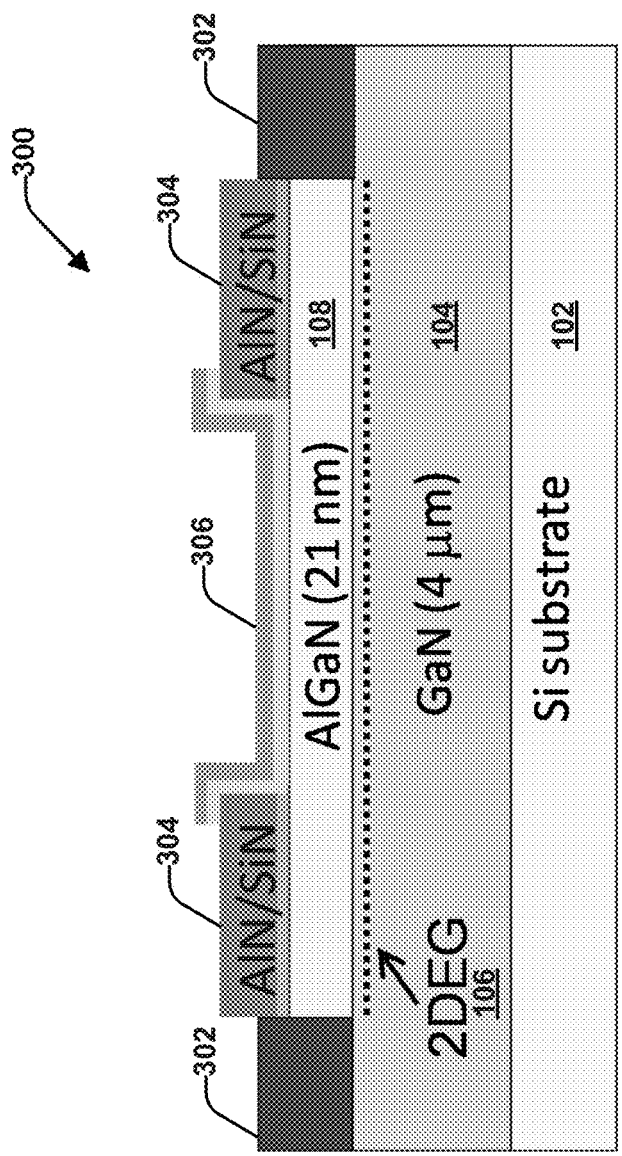
FIG. 3 presents a schematic cross section of an example of Ni/Au—AlGaN/GaN-on-Si Schottky-on-heterojunction light-emitting diode (SoH-LED) that can serve as the on-chip photon source of the disclosed integrated HEMT devices in accordance with various aspects and embodiments described herein.

FIG. 3 presents an example SoH-LED 300 that can serve as the photon source 202 of the disclosed integrated HEMT devices (e.g., device 200 and the like) in accordance with various aspects and embodiments described herein. Repetitive description of like elements employed in respective embodiments described herein is omitted for sake of brevity.

Similar to HEMT devices 100 and 200, SoH-LED 300 includes a substrate 102, a channel layer 104/barrier layer 108 heterostructure formed on the substrate 102, and a 2DEG channel 106 formed at the heterointerface. In an exemplary embodiment, the substrate 102 includes a silicon substrate, the channel layer 104 includes GaN, and the barrier layer 108 includes AlGaN. SoH-LED 300 further includes ohmic cathode electrodes 302 formed on an adjacent to the channel layer 104, a Schottky contact anode electrode 302 formed on an adjacent to a portion of the barrier layer 108 and a passivation layer 304 formed on and adjacent to another portion of the barrier layer 108. In some embodiments, the passivation layer 304 can be removed.

In an example embodiment, the substrate 102 include a p-type silicon substrate 102. The AlGaN/GaN heterostructure can be formed on the substrate 102 via metal-organic chemical vapor deposition (MCOVD). The heterostructure includes a 4 μm GaN channel layer 104 formed on the silicon substrate 102 and a 21 nm AlGaN barrier layer 108 formed on the channel layer 104. The heterostructure further includes a 2DEG layer 106 formed at the heterointerface and having a density of $10^{13}/cm^{-2}$ and a mobility of 2080 $cm^2V^{-1}s^{-1}$. The ohmic contact cathode electrodes 302 can include annealed titanium (Ti), aluminum (Al), nickel (Ni) and gold (Au). Atomic layer deposition (ALD) equipment can be used to remove native oxide from the surface, nitridize the heterostructure surface, and deposit 4 nm of AlN over the AlGaN barrier layer 108. Plasma-enhanced chemical vapor deposition (PECVD) can then used to add a 50 nm $SiN_x$ layer over the 4 nm of AlN. The $AlN/SiN_x$ layer 304 provides passivation and surface protection.

The Schottky contact anode electrode 306 can be fabricated by selectively removing a portion of the passivation layer 304 covering a portion of the barrier layer 108 with a combination of plasma and wet etch. Then a semi-transparent 5 nm/6 nm nickel/gold Schottky contact can be deposited using electron-beam evaporation. SoH-LED device 300 and the like is configured to generate photons in response to application of a positive bias higher than a threshold voltage to anode electrode 306.

With reference back to FIG. 2, the on-chip integration of SoH-LED 300 and HEMT 100 may have different layout for synchronous dynamic operation. In one exemplary embodiment, integrated HEMT device 200 includes an unpassivated GaN channel layer 104/AlGaN barrier layer 108 heterostructure fabricated on a Si substrate 102 with a 2DEG channel 106 at the heterointerface. The integrated device 200 includes an adjacent SoH-LED (e.g., SoH-LED 300) corresponding to the portion of integrated HEMT device 200 included in dashed box 204. The SoH-LED employs the same substrate, channel layer 104/barrier layer 108 heterostructure, and 2DEG layer 106. In an aspect, Ti/Al/Ni/Au metallization is employed as the ohmic contacts for source electrode 110 and the drain electrode 114 and Ni/Au is used to form the gate electrode 112. A semitransparent Ni/Au (5/6 nm) Schottky contact can be used as the anode electrode of the SoH-LED (e.g., anode 306). In one implementation, the electrodes of the HEMT (e.g., the source electrode 110, the gate electrode 112, and the drain electrode 114) and the electrodes of the SoH-LED (e.g., the cathode electrode 302 and the anode electrode 304) are separated. However, in other embodiments, the ohmic drain electrode 114 of the HEMT can serve as the cathode electrode of the SoH-LED (e.g., cathode 302).

Figure 4:
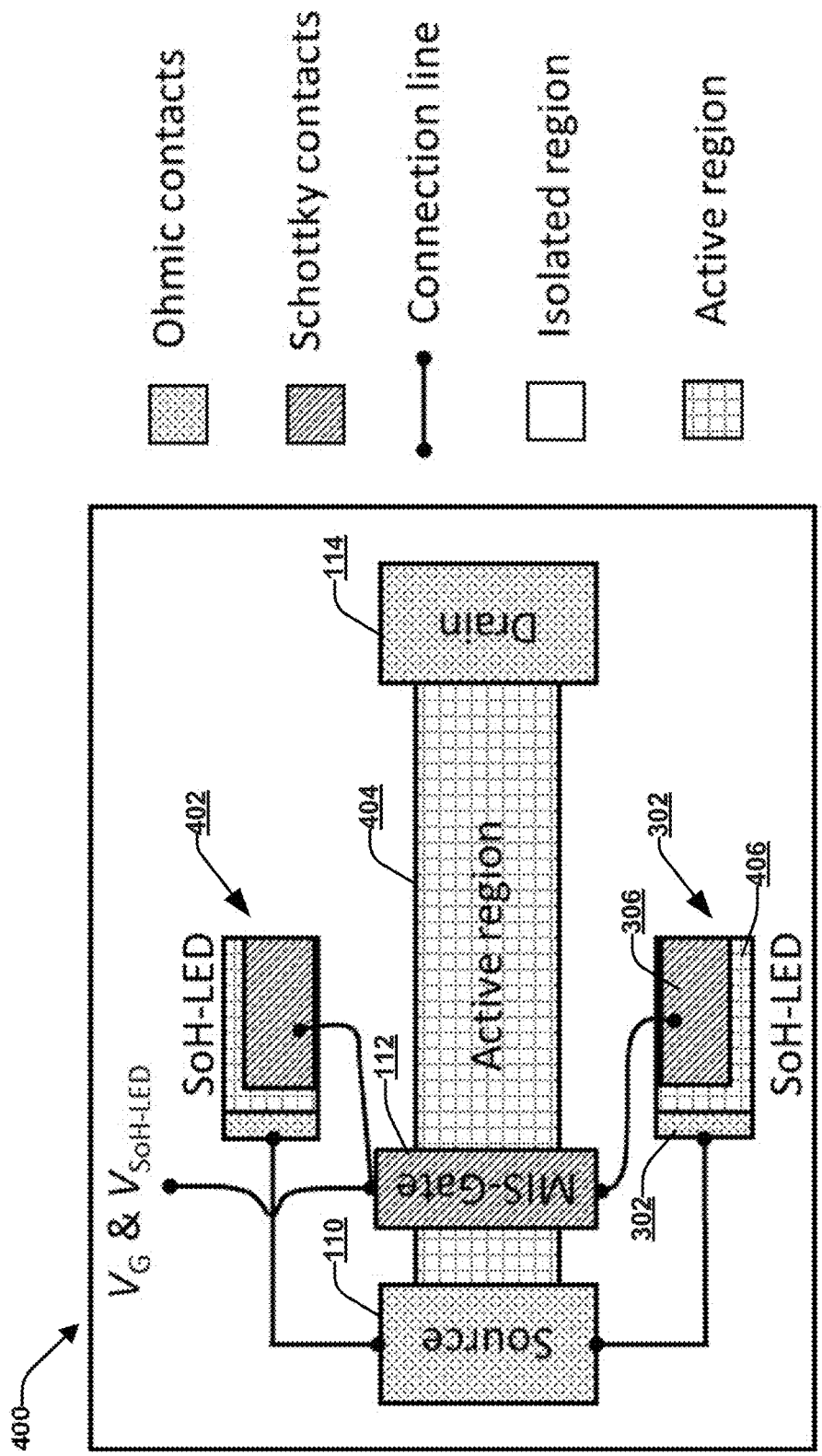
FIG. 4 presents an example of a HEMT device having an integrated SoH-LED as an on-chip photon source in accordance with one or more additional embodiments described herein.

FIG. 4 presents a schematic top-view of another integrated HEMT device 400 having a SoH-LED as an on-chip photon source in accordance with one or more additional embodiments described herein. Device 400, includes same or similar structures, features, and functionality as device 200. Repetitive description of like elements employed in other embodiments described herein is omitted for sake of brevity.

Integrated HEMT device 400 includes a MIS-HEMT and two adjacent SoH-LEDs 402 integrated onto a same chip or substrate. SoH-LEDs 402 can include same or similar features and functionality as SoH-LED 300. For example, the SoH-LEDs 402 include an ohmic cathode electrode 302 and a Schottky contact anode electrode 306. The SoH-LEDs 402 further includes active area 406. In this embodiment, the gate electrode 112 is an MIS gate and the SoH-LEDs 402 are located near the gate-to-drain access region of the MIS-HEMT surrounding the active region 404 of the HEMT (e.g., between the gate electrode 112 and the drain electrode 114).

The cathode electrodes 302 of the SoH-LEDs are in connection with the source electrode 110 of the MIS-HEMT. Accordingly, application of a single voltage to the gate electrode 112 provides current to drive both the MIS-HEMT and the SoH-LED simultaneously. For example, in response to application of a positive bias higher than the threshold voltage (e.g., approximately 2.0 V) to the gate electrode 112 of integrated HEMT device 400, the SoH-LED 402 is configured to emit photons. Thus the SoH-LED are synchronously switched ON and OFF when the HEMT is switched ON and OFF.

The MIS-gate electrode 112 is employed in order to sustain a gate voltage that is also used to turn-on the SoH-LED light. This embodiment give a simple drive scheme that the channel of the MIS-HEMT and the SoH-LED can be turned-on simultaneously. An offset voltage can be added between the anode voltage of the SoH-LED and the gate voltage of the MIS-HEMT.

FIG. 5 presents a schematic cross section of an integrated HEMT device 500 demonstrating electron trapping into surface traps and channel traps in the access region induced by OFF-state high drain bias in accordance with various aspects and embodiments described herein. For exemplary purposes, the HEMT device 500 depicted in FIG. 5 includes a SoH-LED as the photon source 202. In order to demonstrate the feasibility of photon pumping of surface traps using a SoH-LED, the integrated HEMT device 500 is intentionally unpassivated. Repetitive description of like elements employed in respective embodiments described herein is omitted for sake of brevity.

Electrons predominantly get trapped at surface traps in the gate-to-drain access region (e.g., surface region 116) by conducting OFF-state drain bias stress, resulting in the increase of dynamic Ron, (i.e. current collapse).

FIG. 6 presents another schematic cross section of integrated HEMT device 500 illustrating the photon generation from SoH-LED and its propagation to assist electron de-trapping. Repetitive description of like elements employed in respective embodiments described herein is omitted for sake of brevity.

When the integrated HEMT device 200 is switched ON following OFF-state stress, the photon source 202 generates photons 602 which propagate to the surface region 116 traps and the channel region 118 traps. Trapped electrons are excited to a higher energy level through absorption of a photon with certain energy, thereby causing them to escape from the respective traps. Accordingly the photon pumping provided by the on-chip photon source 202 can effectively accelerate the carrier de-trapping process and enhance the dynamic performances of electronic devices employing the subject integrated HEMT devices (e.g., devices 200, 400, 500 and the like).

Figure 7:
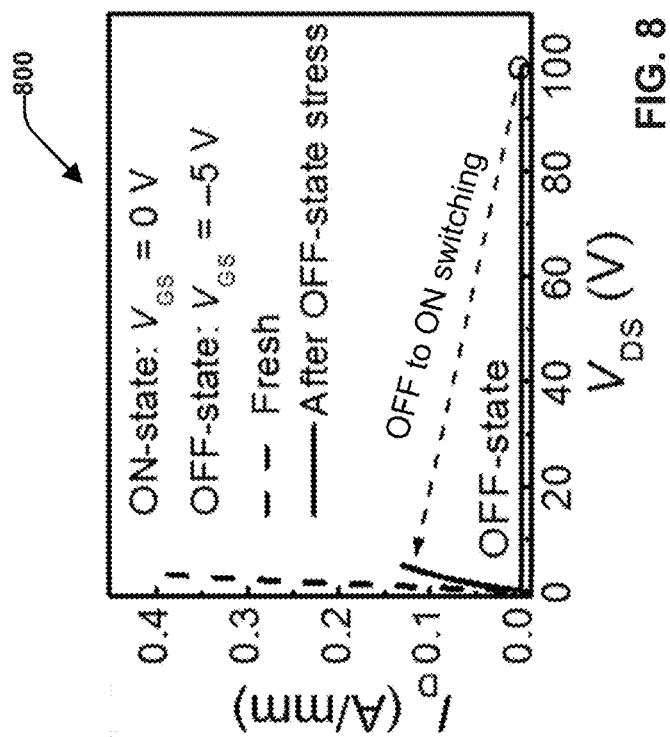
FIGS. 7-8 provide the transfer and output characteristics of an example HEMT before and after OFF-state high drain bias stress.
Figure 8:
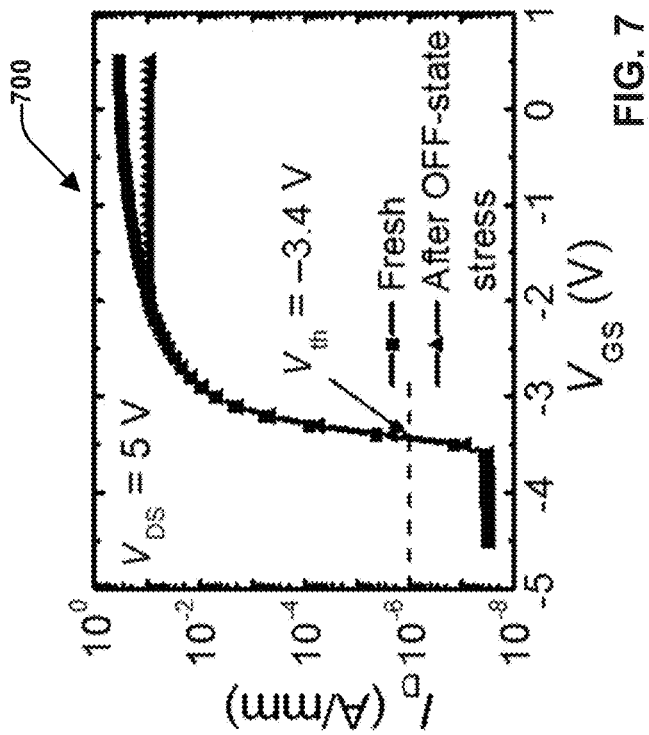

FIGS. 7-8 provide the transfer and output curves of the HEMT (FIG. 5) before and after OFF-state high drain bias stress up to 100 V. The device in intentionally unpassivated for more distinct surface trapping. Repetitive description of like elements employed in respective embodiments is omitted for sake of brevity.

With reference to the drawings, FIG. 7 presents a graph 700 illustrating the transfer characteristics of the integrated HEMT device 500 when fresh (e.g., before electrons get trapped in deep traps), and after OFF-state drain bias stress.

FIG. 8 presents a graph 800 illustrating the output curves of the integrated HEMT device 500 measured before and after the OFF-state drain bias stress. After 100-V OFF-state drain bias stress, the $V_{th}$ does not show measurable shift, while the drain current becomes smaller.

Figure 10:
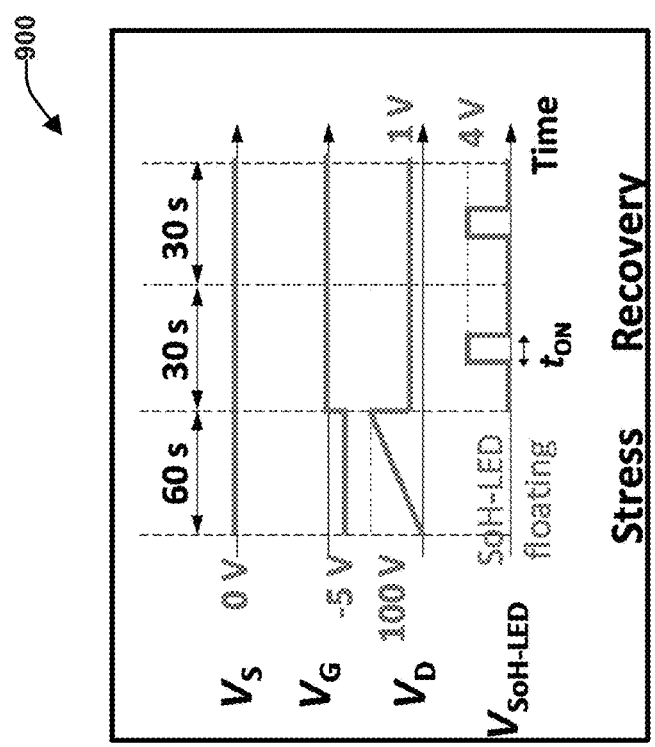
Figure 9:
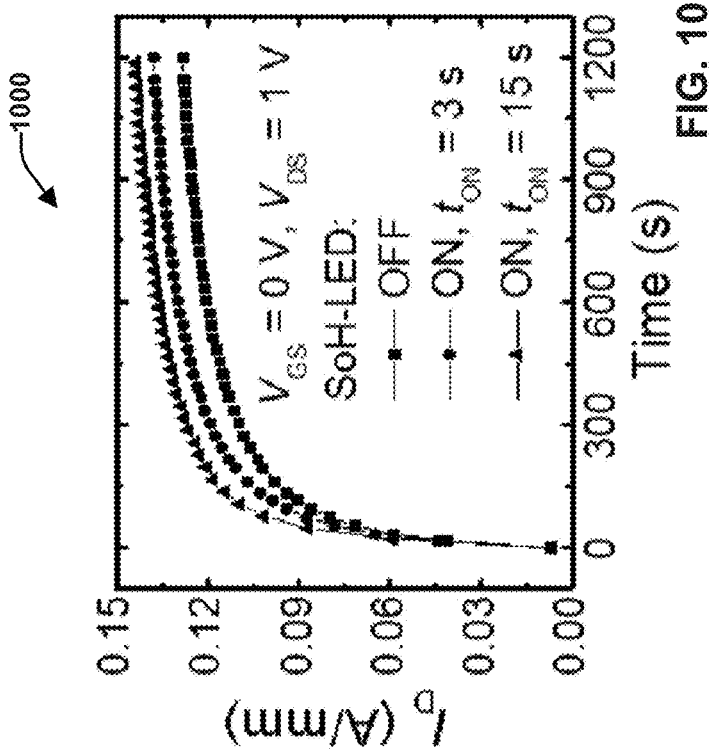

FIGS. 9-10 provide graphical visualizations of bias sequences applied to device 500 for OFF-state drain bias stress and monitoring of the drain current recovering. Repetitive description of like elements employed in respective embodiments is omitted for sake of brevity.

Then the effect of photon pumping of surface traps in an unpassivated HEMT using an on-chip SoH-LED (e.g., integrated HEMT device 500) can be revealed by monitoring the recovery of drain current at the ON-state with and without the SoH-LED electroluminescence ON.

FIG. 9 presents a graph 900 illustrating the waveforms of $V_S$, $V_G$, $V_D$, and $V_{SoH\text{-}LED}$ during the sequence of the OFF-state drain bias stress and recovery process (with substrate grounded). During recovery, the drain current of the HEMT were monitored and the SoH-LED were turned on every 30 seconds.

FIG. 10 shows the recovery curves of $I_D$ (monitored at $V_{GS}=0$ V and $V_{DS}=1$ V) after OFF-state drain bias stress. During recovery, the drain current was monitored with or without a pre-EL-ON period of the SoH-LED. The line with the squares depicts recovery of the drain current with the SoH-LED OFF, the line with the circles depicts recovery of the drain current with the SoH-LED ON for 3 seconds, and the line with the triangles depicts recovery of the drain current with the SoH-LED ON for 15 seconds. As shown in FIG. 10, the recovery process of $I_D$ is significantly accelerated as a result of the on-chip SoH-LED photons. This proves surface traps can be pumped by the on-chip generated photons.

Figure 11:
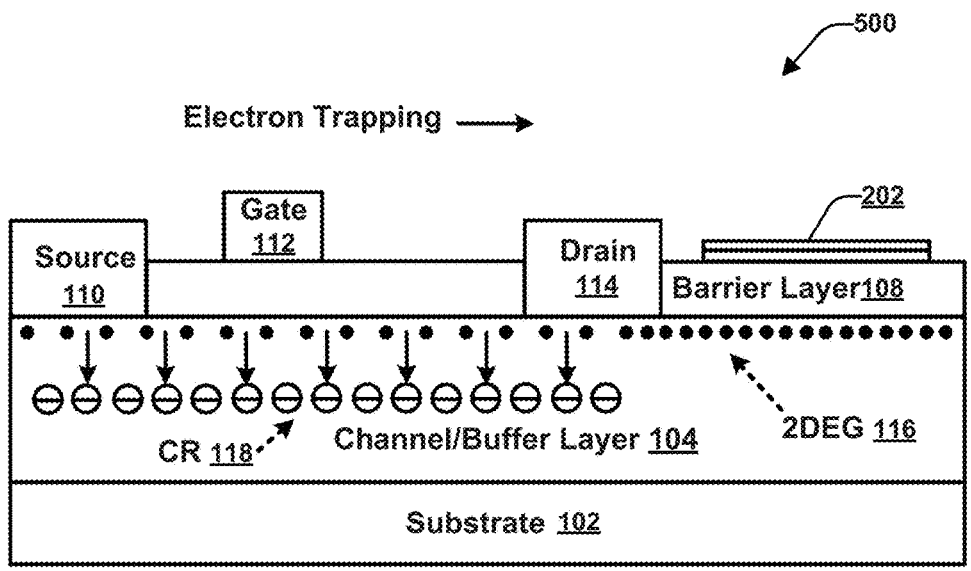
FIG. 11 presents a schematic cross section of integrated HEMT device illustrating electron trapping into channel or bulk traps induced by high positive substrate bias stress when the HEMT device in accordance with various aspects and embodiments described herein.

FIG. 11 presents a schematic cross section of integrated HEMT device 500 demonstrating electron trapping into channel or bulk traps induced by high positive substrate bias stress in accordance with various aspects and embodiments described herein. Repetitive description of like elements employed in respective embodiments described herein is omitted for sake of brevity.

In order to generate trapped electrons under the gate electrode 112 of the integrated HEMT device 500 in channel or buffer traps (e.g., the channel regions 118) as depicted in FIG. 11, a positive substrate bias stress was applied to HEMT device 500 while keeping the source/gate/drain bias at zero volt to eliminate the electron trapping into surface traps. For example, as shown in FIG. 11, under a positive substrate bias stress, electrons become trapped in bulk/channel traps in the channel region 118 (as indicated by the electron arrows pointing away from the 2DEG channel layer 116). In an aspect, the positive substrate bias stress was greater than or equal to about 300 V.

Figure 12:
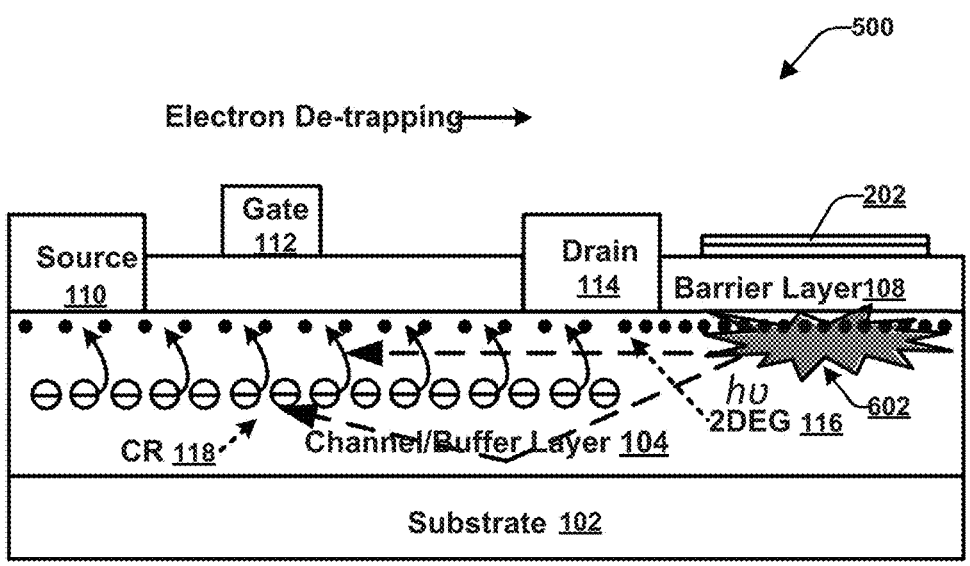
FIG. 12 presents another schematic cross section of integrated HEMT illustrating electron de-trapping from bulk traps assisted by photons generate from the on-chip integrated SoH-LED.

FIG. 12 presents another schematic cross section of integrated HEMT device 500 demonstrating photon pumping of channel or bulk traps effectuated by the on-chip SoH-LED 202 in response to switching the HEMT device 500 from the OFF-state to an ON-state. Repetitive description of like elements employed in respective embodiments described herein is omitted for sake of brevity.

When the integrated HEMT device 500 is switched ON following OFF-state stress, the photon source 202 (e.g., the SoH-LED is switched ON) and generates photons 602 which propagate to the bulk/channel region 118 traps. The trapped electrons are excited to a higher energy level through absorption of a photon with certain energy, thereby causing them to escape from the respective traps and return to the 2DEG channel layer 116 (as indicated by the electron arrows pointing toward the 2DEG channel layer 116). Accordingly the photon pumping provided by the on-chip photon source 202 can effectively accelerate the carrier de-trapping process and enhance the dynamic performances of electronic devices employing the subject integrated HEMT devices (e.g., devices 200, 400, 500 and the like).

Figures 13, 14:
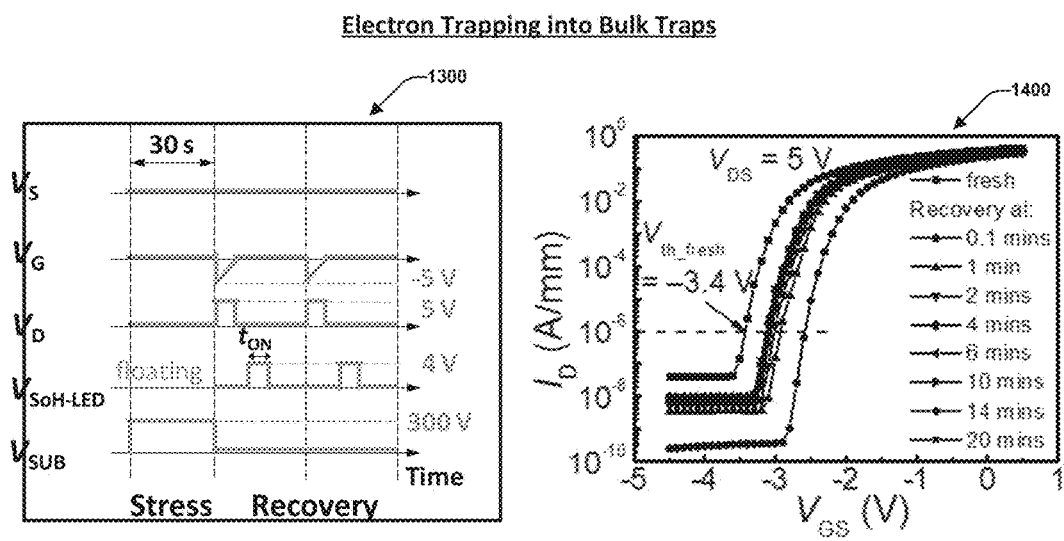
FIGS. 13-14 provide the voltage sequences applied to integrated HEMT and SoH-LED during positive substrate bias stress and subsequent recovering, and the transfer curves before stress and during the post-stress recovering.

FIGS. 13-14 provide graphical visualizations of the waveforms of $V_S$, $V_G$, $V_D$, $V_{sub}$ and $V_{SoH\text{-}LED}$ during the sequence of substrate bias stress and recovery process of the transfer curve, in accordance with various aspects and embodiments described herein. Repetitive description of like elements employed in respective embodiments is omitted for sake of brevity.

As shown in FIG. 11, under positive substrate bias stress, electrons can be injected into bulk or channel traps under the gate electrode 112 of the integrated HEMT device 500. This leads to a positive shift of $V_{th}$ when the integrated HEMT device is switched back ON.

FIG. 14 presents a graph 1400 illustrating the transfer curves of the integrated HEMT device 500 measured before and after 30 seconds of substrate bias stress at $V_{SUB}=300$ V and $V_G=V_S=V_D=0$ V. The $V_{SBD}$ was set as floating during the stress and transfer curve measurements. As shown in FIG. 14, the $V_{th}$ was positively shifted due to electron trapping into bulk/channel traps underneath the gate region and recovers slowly.

The effect of photon pumping of bulk/channel traps in an unpassivated HEMT using an on-chip SoH-LED (e.g., integrated HEMT device 500) can be revealed by measuring the recovery of $V_{th}$ with the SoH-LED OFF and ON following the application of positive substrate bias stress.

Figure 15:
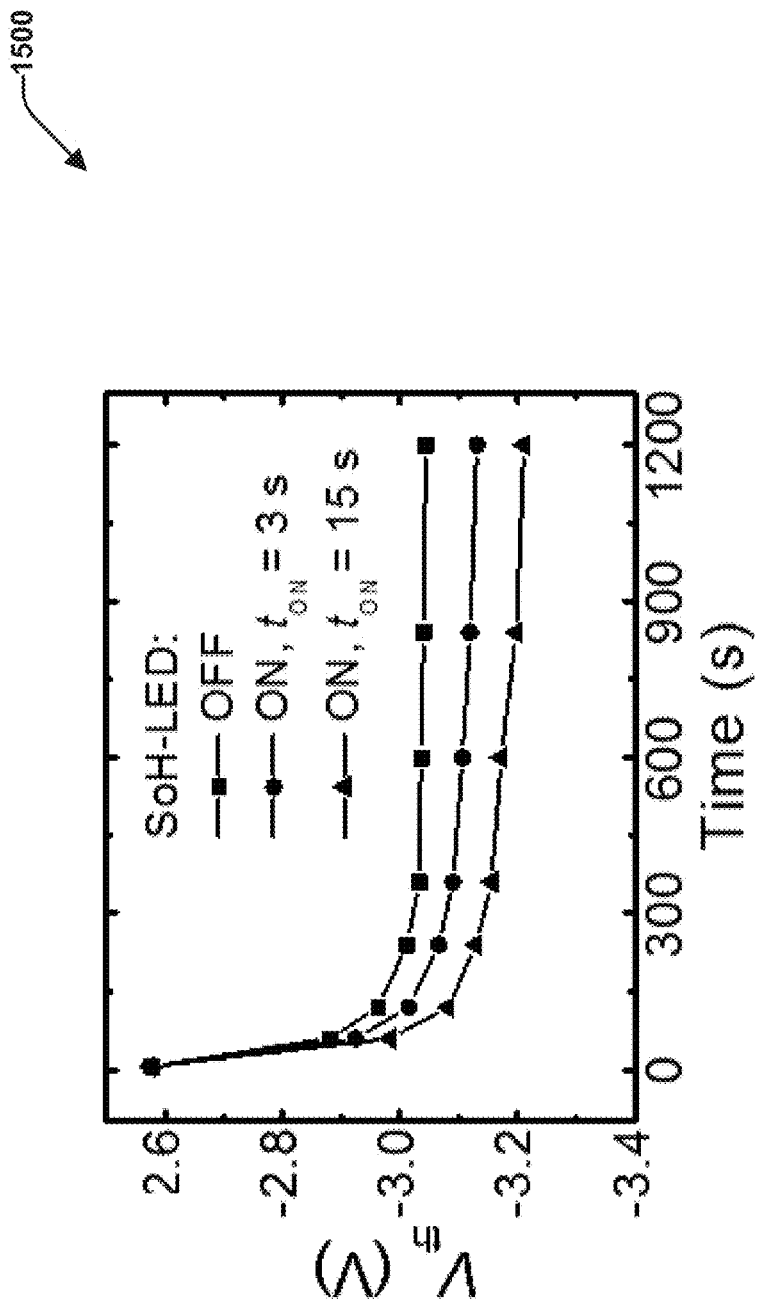
FIG. 15 provide the recovery of threshold voltage of the transfer curve as electron de-trapping from the bulk deep traps, without and with the SoH-LED ON for different durations.

FIG. 15 presents a graph 1500 of the recovery curves of the $V_{th}$ after substrate stress with and without the SoH-LED ON. The line with the squares corresponds to the recovery curve with the SoH-LED always OFF, the line with the circles corresponds to the recovery curve with the SoH-LED ON for 3 seconds, and the line with the triangles corresponds to the recovery curve with the SoH-LED ON for a period of 15 seconds before each measurement. As shown in FIG. 15 the recovery of $V_{th}$ (i.e., the de-trapping of bulk/channel traps), can be significantly accelerated by the on-chip SoH-LED photons.

Figure 16:
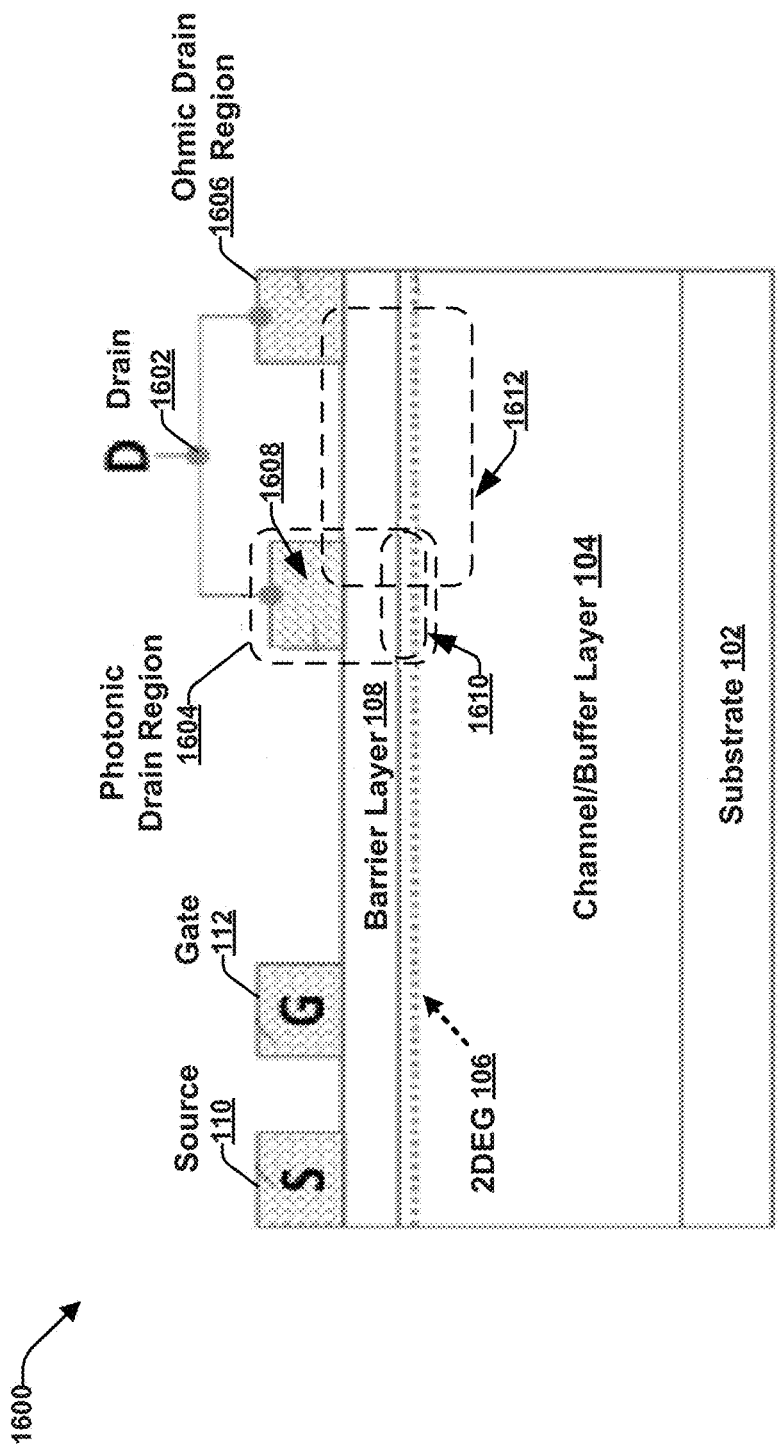
FIG. 16 presents a cross-sectional view of an example PODFET in accordance with various aspects and embodiments described herein.

FIG. 16 presents a cross-sectional view of an example PODFET 1700 in accordance with various aspects and embodiments described herein. Repetitive description of like elements employed in other embodiments described herein is omitted for sake of brevity.

Similar to the integrated HEMT devices discuss supra, the subject PODFET devices (e.g., PODFET 1600) includes a HEMT structure with an on-chip photon generation source that is configured to facilitate de-trapping of electrons from deep traps formed therein during dynamic device operation. However, rather than employing an on-chip photon source (e.g., an SoH-LED) adjacent to the HEMT structure, the subject PODFETs (e.g., POEDFET 1600 and the like) integrate the photon generation structure into the drain electrode of a power HEMT. In particular, the PODFET 1600 (and the like) includes a power HEMT structure with a drain electrode that consists of two parts, an ohmic drain region and a photonic drain region. The effective bias for photon emission is generated spontaneously by the channel current and inherent resistance of the channel region. Therefore, the subject PODFET 1600 realizes the functionality of self-photon-generation simultaneously with dynamic switching of the channel current.

In one or more embodiments, PODFET 1600 includes a channel/buffer layer 104/barrier layer 108 heterostructure formed on a substrate 102 with a 2DEG channel 106 formed at the heterointerface. In an exemplary embodiment, the channel layer 104/barrier layer 108 heterostructure is a GaN/AlGaN heterostructure (e.g., the channel layer 104 includes GaN and the barrier layer includes AlGaN) formed on a silicon substrate. PODFET 1600 further includes a source electrode 110, a drain electrode 1602, and a gate electrode 112 formed between the source electrode and the drain electrode. Unlike the drain electrode 114 of the subject integrated HEMTs (e.g., HEMT 200, 400, 500 and the like), drain electrode 1602 is a photonic-ohmic drain (POD). The POD consists of a photonic drain region 1604 or photonic drain and an ohmic drain region 1606 or ohmic drain. In an exemplary embodiment, the photonic drain region 1604 is formed with a SoH-LED structure.

The ohmic drain region 1606 is electrically connected to the 2DEG channel 106. The photonic drain region 1604 includes an anode portion 1608 and a cathode portion 1610. The anode portion 1608 of the photonic drain region 1606 is electrically shorted with the ohmic drain region 1606, while the cathode portion 1610 of the photonic drain region 1604 is served by the 2DEG channel 106 beneath the anode portion 1608.

Although a Schottky-gate and an AlGaN/GaN heterostructure is used to illustrate the various implementations of a PODFET, it should be understood that a MIS-gate or a MOS-gate with a recessed channel and/or further modifications of the AlGaN/GaN heterostructure such as adding insertion and/or capping layers and/or various passivation layers can also be employed.

Figure 17:
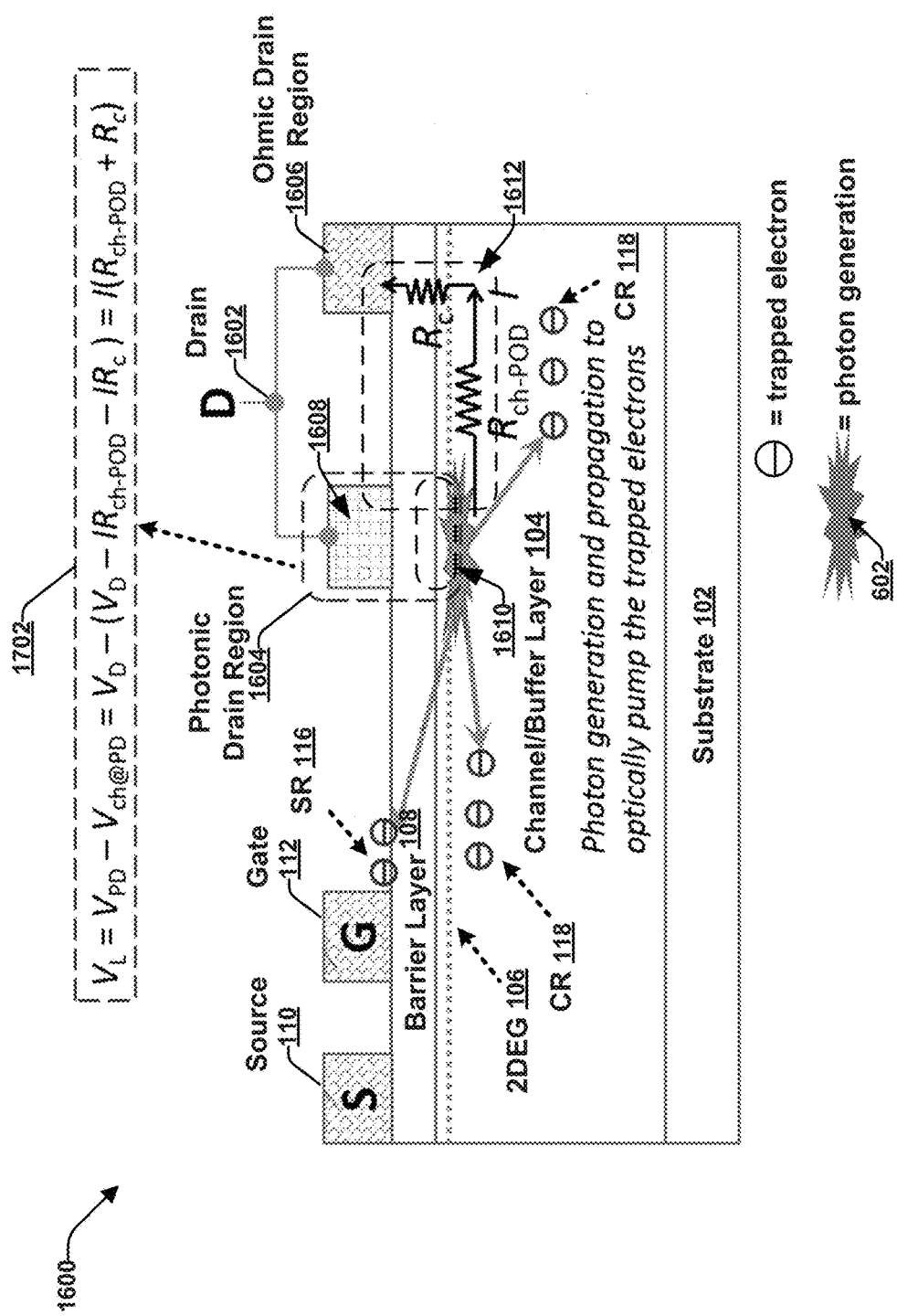
FIG. 17 illustrates the working principle of a PODFET, effective bias applied on the photonic drain and the process of photon generation and propagation to pump the trapped electrons, in accordance with various aspects and embodiments described herein.

FIG. 17 illustrates the process of photon generation 602 in PODFET 1600 in accordance with various aspects and embodiments described herein. Repetitive description of like elements employed in respective embodiments is omitted for sake of brevity.

The photonic drain region 1604 of PODFET 1600 is configured to generate photons in response to an effective bias established across the anode portion 1608 and the cathode portion 1610 that is generated based on the 2DEG channel 106 current established in the PODFET during the ON-state and a level of resistance associated with the access region 1612 between the photonic drain region 1604 and the ohmic drain region 1606 and the contact resistant of ohmic drain 1606. In particular, the effective bias across the anode portion 1608 and the cathode portion 1610 of the photonic region is generated spontaneously by the inherent 2DEG channel 106 current and the inherent resistance of the channel, which consists of the channel resistance ($R_{ch}$) of the access region 1612 between the photonic drain region 1604 and the ohmic drain region 1606 (which includes portions of the barrier layer 108 and the channel layer 104), and the contact ($R_c$) resistance of the ohmic drain region 1606.

The photons are generated in the 2DEG channel 106 near the barrier layer 108/channel layer 104 heterointerface. The photons propagate through the channel layer 104 to pump the bulk traps in the channel regions 118, and through barrier layer 108 to pump the surface traps in surface region 116 and interface traps at the dielectric/barrier layer interface.

The photon generation 602 in PODFET 1600 is switched ON/OFF simultaneously with the channel current. Call out box 1702 illustrates the working principle of photon generation from the photonic drain, where $V_L$ is the effective bias across the anode 1608 and cathode 1610 of photonic drain $V_{PD}$ is the external voltage applied to the anode 1608 of photonic drain, $V_{ch@PD}$ is the voltage at the cathode 1610 of the photonic drain, $V_D$ is the applied drain voltage, $IR_{ch\text{-}POD}$ is the voltage drop along the channel between photonic drain and ohmic drain, $IR_c$ is the voltage drop of the contact resistance of the ohmic drain, I is the channel current $R_{ch\text{-}PO}$ is the channel resistance between the photonic drain and ohmic drain and $R_c$ is the contact resistance of the ohmic drain. Therefore, PODFET 1600 is a compact structure that can realize the functionality of self-photon generation and photon pumping of traps which operated naturally in synchronous mode with the channel current during power switching, consequently eliminating any peripheral control circuit.

An amount of photons emitted from the photonic drain region 1604 when the PODFET is turned on is based on a drain voltage of the PODFET and/or a channel current of the PODFET. As noted above, the channel resistance $R_{ch\text{-}POD}$ between the photonic drain region 1604 and the ohmic drain region 1606 is one of the parameters that determines the effective bias to generate photons. For example, the drain voltage and/or the channel current required for photon generation 602 by the photonic drain region 1604 is reduced as a level of resistance of the access region 1612 formed between the photonic drain region 1604 and the ohmic drain region 1606 is increased. Therefore, given a certain level of channel current for photon generation, one preferred embodiment to reduce the overall device area and reduce the threshold drain voltage and/or channel current required for photon generation 602 is to increase the $R_{ch\text{-}POD}$ by techniques such as plasma treatment, ion implantation, and/or partial recess in the access region between photonic drain and ohmic drain.

Figure 18:
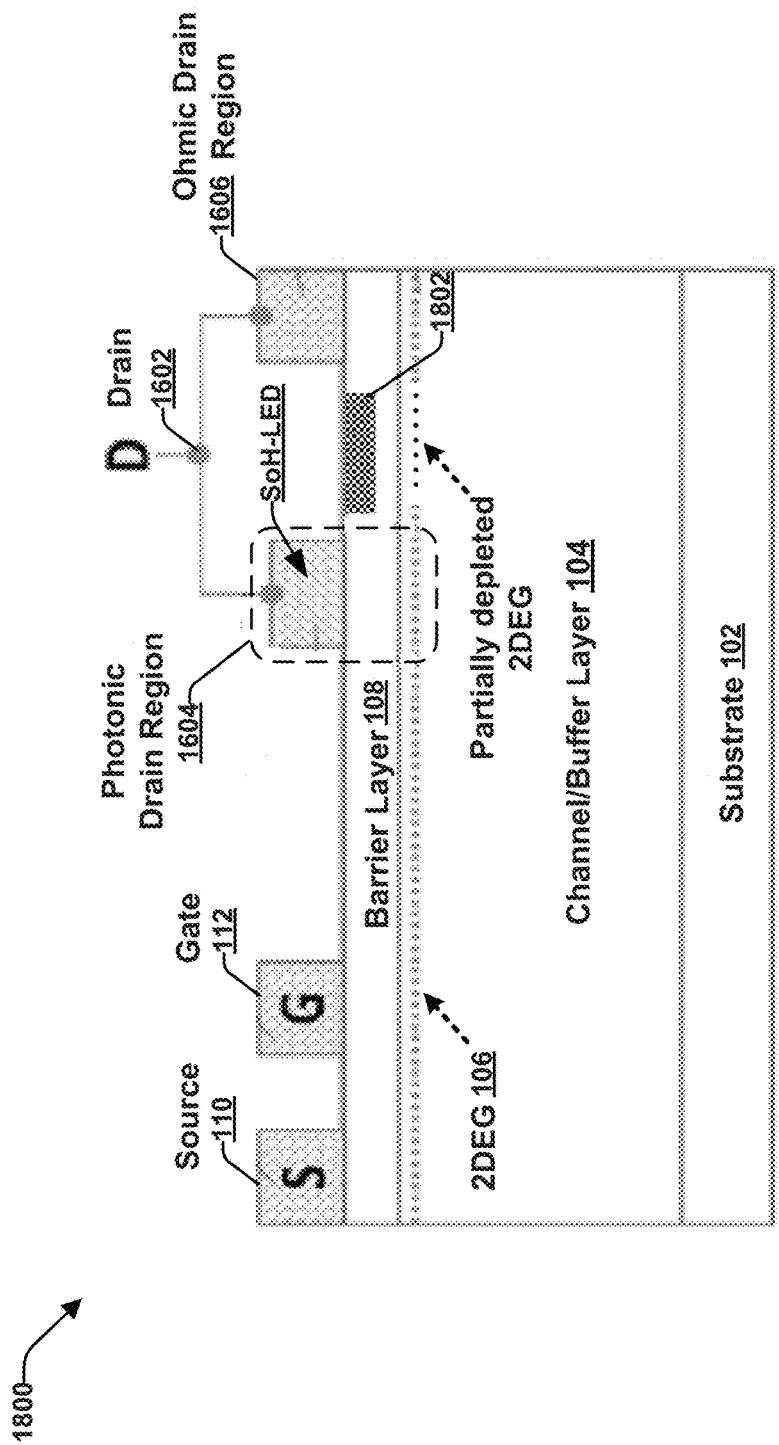
FIG. 18 presents a cross-sectional view of another example PODFET with the channel resistance between photonic drain and ohmic drain modulated by plasma (such as fluorine) treatment in accordance with various aspects and embodiments described herein.

FIG. 18 presents a cross-sectional view of another example PODFET 1800 in accordance with various additional aspects and embodiments described herein. PODFET 1800 includes similar features and functionality as PODFET 1600. Repetitive description of like elements employed in other embodiments described herein is omitted for sake of brevity.

In accordance with this embodiment, PODFET 1800 includes a SoH-LED as the photonic drain region 1604 and a selectively treated region 1802 of the barrier layer 108 between the photonic drain region 1604 and the ohmic drain region 1606 by plasma such as fluorine plasma. Other suitable plasma treatment for region 1802 can include but is not limited to, plasma treatment with oxygen plasma. Plasma treatment of region 1802 increases the channel resistance $R_{ch\text{-}POD}$ between the photonic drain region 1604 and the ohmic drain region 1606. As a result, the therein a drain voltage and/or the channel current needed for photon generation by the photonic drain region 1604 can be reduced as the level of resistance of the access region formed between the photonic drain region and the ohmic drain region is increased.

In addition, increasing the channel resistance $R_{ch\text{-}POD}$ between the photonic drain region 1604 and the ohmic drain region 1606 serves to decrease the required distance between photonic drain and ohmic drain.

Figure 19:
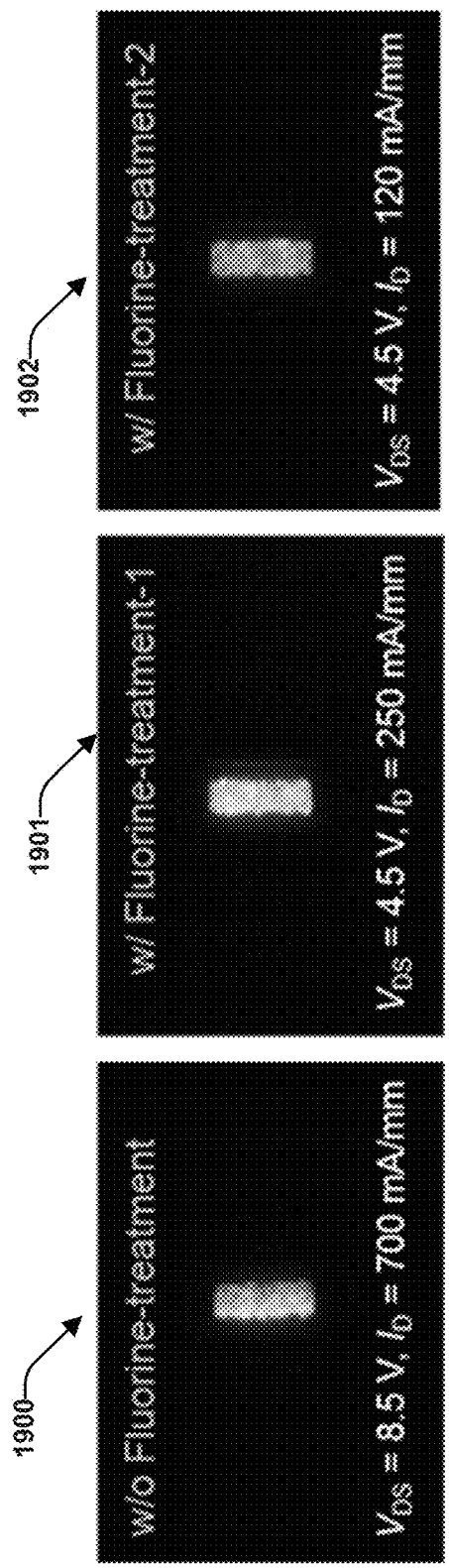
FIG. 19 shows the modulation of threshold voltage/current for photon generation from the photonic drain of a PODFET when increasing $R_{ch-POD}$ using fluorine plasma treatment in the portion of the barrier layer between the photonic drain region and the ohmic drain region.

FIG. 19 shows the modulation of threshold drain voltage/current for photon generation by PODFET 1800 when increasing $R_{ch\text{-}POD}$ using fluorine plasma treatment in the portion of the barrier layer 108 between the photonic drain region 1604 and the ohmic drain region 1606. Image 1900 presents an amount of light and associated photons generated via the SoH-LED photonic drain region 1604 without fluorine treatment at a threshold voltage of 8.5 V and a channel current of 700 mA/mm Image 1901 presents an amount of light and associated photons generated via the SoH-LED photonic drain region 1604 with fluorine treatment condition-1 resulting in a threshold drain voltage of 4.5 V and a channel current of 250 mA/mm Image 1902 presents an amount of light and associated photons generated via the SoH-LED photonic drain region 1604 with fluorine treatment condition-2 resulting in a threshold drain voltage of 4.5 V and a channel current of 120 mA/mm.

Figure 20:
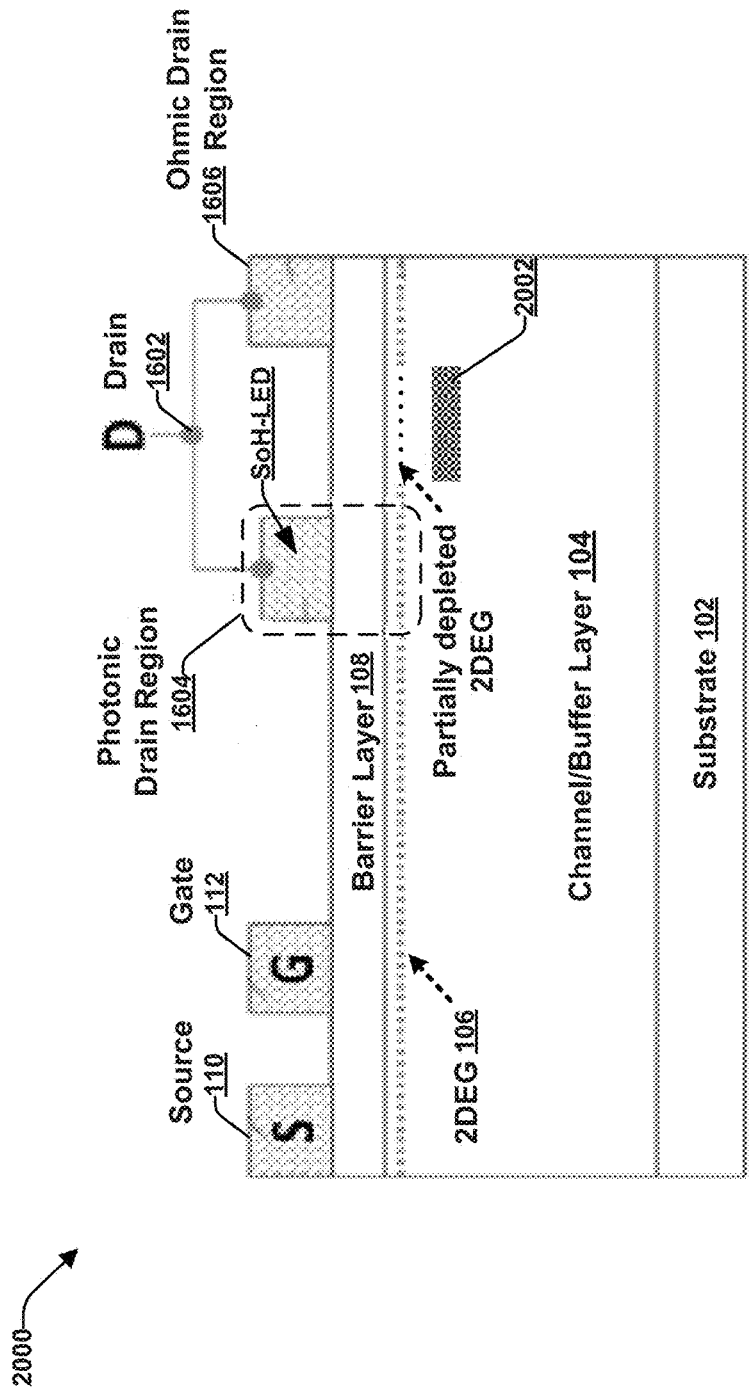
FIG. 20 presents a cross-sectional view of another example PODFET with the channel resistance between photonic drain and ohmic drain modulated by ion (such as fluorine) implantation in accordance with various additional aspects and embodiments described herein.

FIG. 20 presents a cross-sectional view of another example PODFET 2000 in accordance with various additional aspects and embodiments described herein. PODFET 2000 includes similar features and functionality as PODFET 1600. Repetitive description of like elements employed in other embodiments described herein is omitted for sake of brevity.

In accordance with this embodiment, PODFET 2200 includes a SoH-LED as the photonic drain region 1604 and a selectively treated region 2002 of the channel layer 104 between the photonic drain region 1604 and the ohmic drain region 1606 by ion implantation, such as fluorine ion implantation.

Ion implantation of region 2002 increases the channel resistance $R_{ch\text{-}POD}$ between the photonic drain region 1604 and the ohmic drain region 1606. As a result, the therein a threshold drain voltage and/or the channel current needed for photon generation by the photonic drain region 1604 can be reduced as the level of resistance of the access region formed between the photonic drain region and the ohmic drain region is increased.

Figure 21:
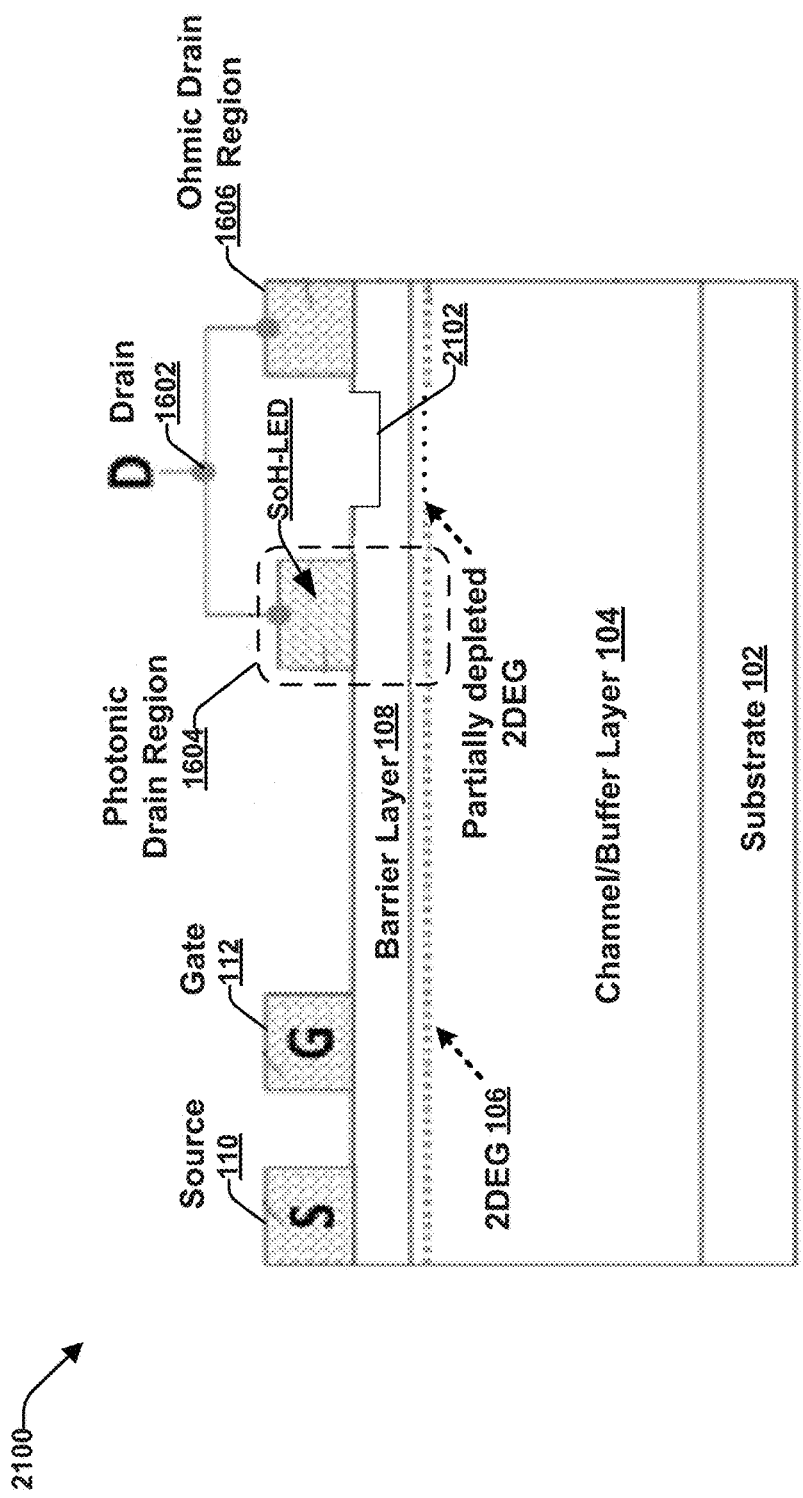
FIG. 21 presents a cross-sectional view of another example PODFET with the channel resistance between photonic drain and ohmic drain modulated by partial recess in accordance with various additional aspects and embodiments described herein.

FIG. 21 presents a cross-sectional view of another example PODFET 2100 in accordance with various additional aspects and embodiments described herein. PODFET 2100 includes similar features and functionality as PODFET 1600. Repetitive description of like elements employed in other embodiments described herein is omitted for sake of brevity.

In accordance with this embodiment, PODFET 2100 includes a SoH-LED as the photonic drain region 1604 and a selectively partially recessed region 2102 of the barrier layer 108 between the photonic drain region 1604 and the ohmic drain region 1606. The partially recess of region 2102 increases the channel resistance $R_{ch\text{-}POD}$ between the photonic drain region 1604 and the ohmic drain region 1606. As a result, the therein a threshold drain voltage and/or the channel current needed for photon generation by the photonic drain region 1604 can be reduced as the level of resistance of the access region formed between the photonic drain region and the ohmic drain region is increased.

Figure 22:
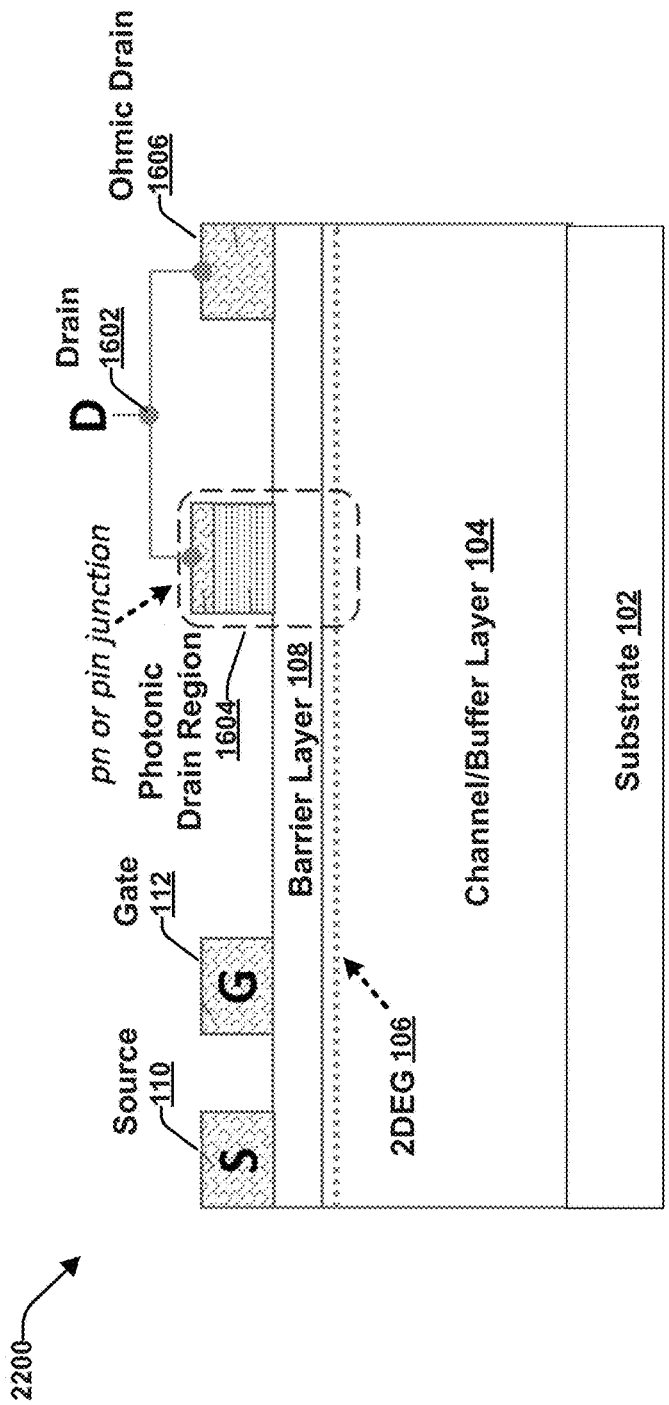
FIG. 22 presents a cross-sectional view of another example PODFET with the photonic drain formed with pn or pin junctions in accordance with various additional aspects and embodiments described herein.

FIG. 22 presents a cross-sectional view of another example PODFET 2200 in accordance with various additional aspects and embodiments described herein. PODFET 2200 includes similar features and functionality as PODFET 1600. Repetitive description of like elements employed in other embodiments described herein is omitted for sake of brevity.

In accordance with this embodiment, PODFET 2200 includes a pn junction or a pin junction for the photonic drain region. When photons are generated in the pn or pin junction above the barrier layer 108/channel layer 104 heterostructure (e.g., an AlGaN/GaN heterostructure), the photons can propagate through passivation layers (not shown) and/or the pn or pin junction layers and/or the barrier layer 108 and/or the channel layer 104 to pump the electron traps locating at the surface or interface or in the bulk.

Figure 23:
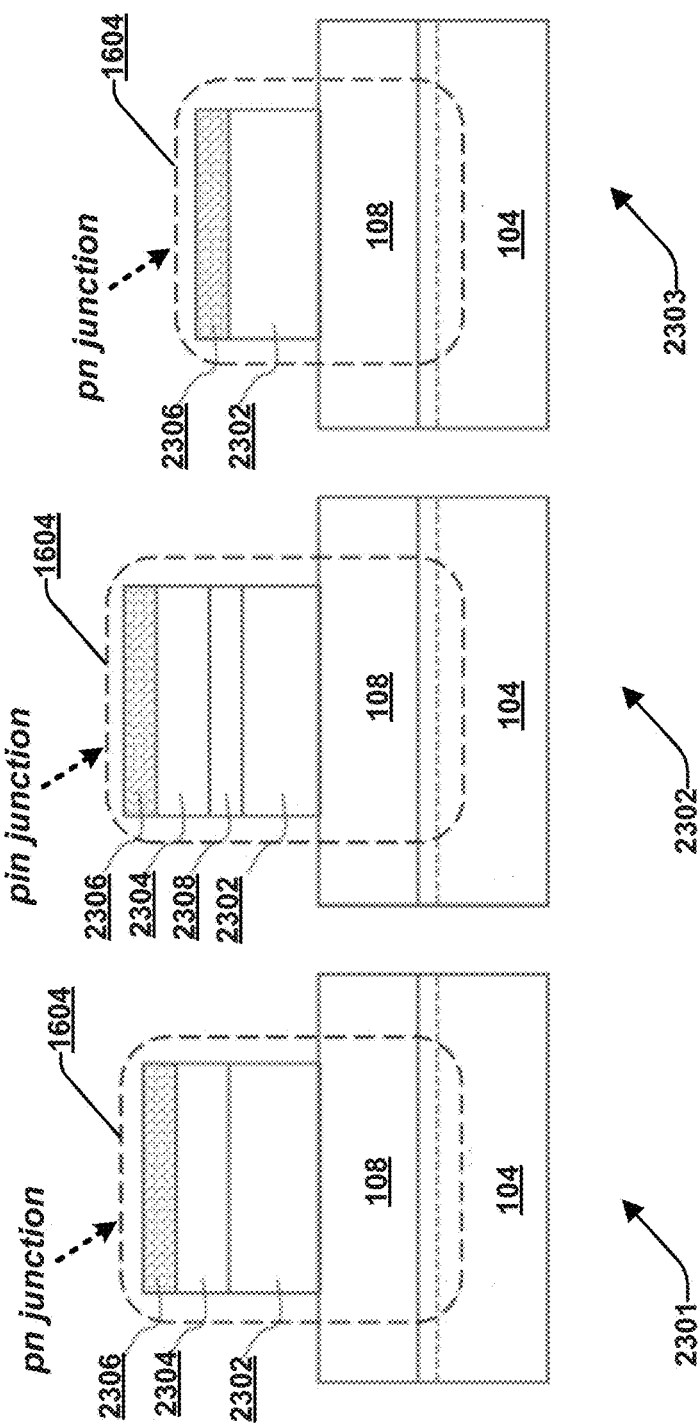
FIG. 23 presents three cross-sectional views of possible pn and pin junctions that can serve as the photonic drain region of a PODFET in accordance with various aspects and embodiments described herein.

FIG. 23 presents three cross-sectional views of possible pn and pin junctions that can serve as the photonic drain region 1604 of a PODFET (e.g., PODFET 2400 and the like) in accordance with various aspects and embodiments described herein. Repetitive description of like elements employed in other embodiments described herein is omitted for sake of brevity.

In view 2301, the photonic drain region 1604 includes a pn diode with a three layer structure formed on an adjacent to the barrier layer 108. The pn diode includes a n-type contact layer 2302, a p-type layer 2304, and a metal electrode layer 2306.

In view 2302, the photonic drain region 1604 includes a pin diode with a four layer structure formed on an adjacent to the barrier layer 108. The pin diode includes a n-type contact layer 2302, a intrinsic layer 2308, and a p-type layer 2304, and a metal electrode layer 2306.

In view 2303, the photonic drain region 1604 includes a metal electrode 2306, a p-type layer 2302 with the barrier 108 serves as the insulating layer and channel layer 104 serves as the n-type layer.

Figure 24:
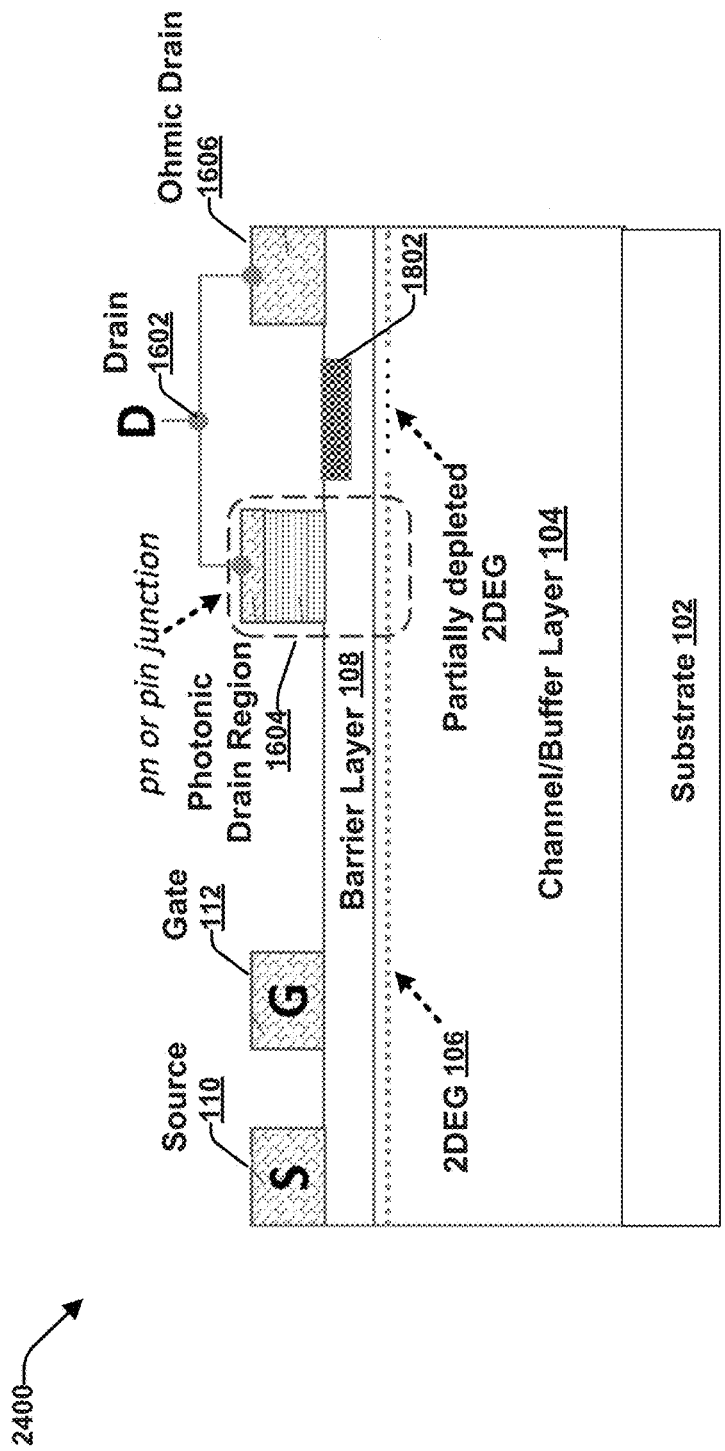
FIG. 24 presents a cross-sectional view of another example PODFET with the photonic drain formed with pn or pin junctions and the channel resistance between photonic drain and ohmic drain modulated by plasma (such as fluorine) treatment in accordance with various additional aspects and embodiments described herein.

FIG. 24 presents a cross-sectional view of another example PODFET 2400 in accordance with various additional aspects and embodiments described herein. PODFET 2400 includes similar features and functionality as PODFET 2200. In accordance with this embodiment, PODFET 2400 includes a pn or pin junction for the photonic drain region 1604 and a selectively treated region 1802 of the barrier layer 108 between the photonic drain region 1604 and the ohmic drain region 1606 by plasma such as fluorine plasma. Repetitive description of like elements employed in other embodiments described herein is omitted for sake of brevity.

Figure 25:
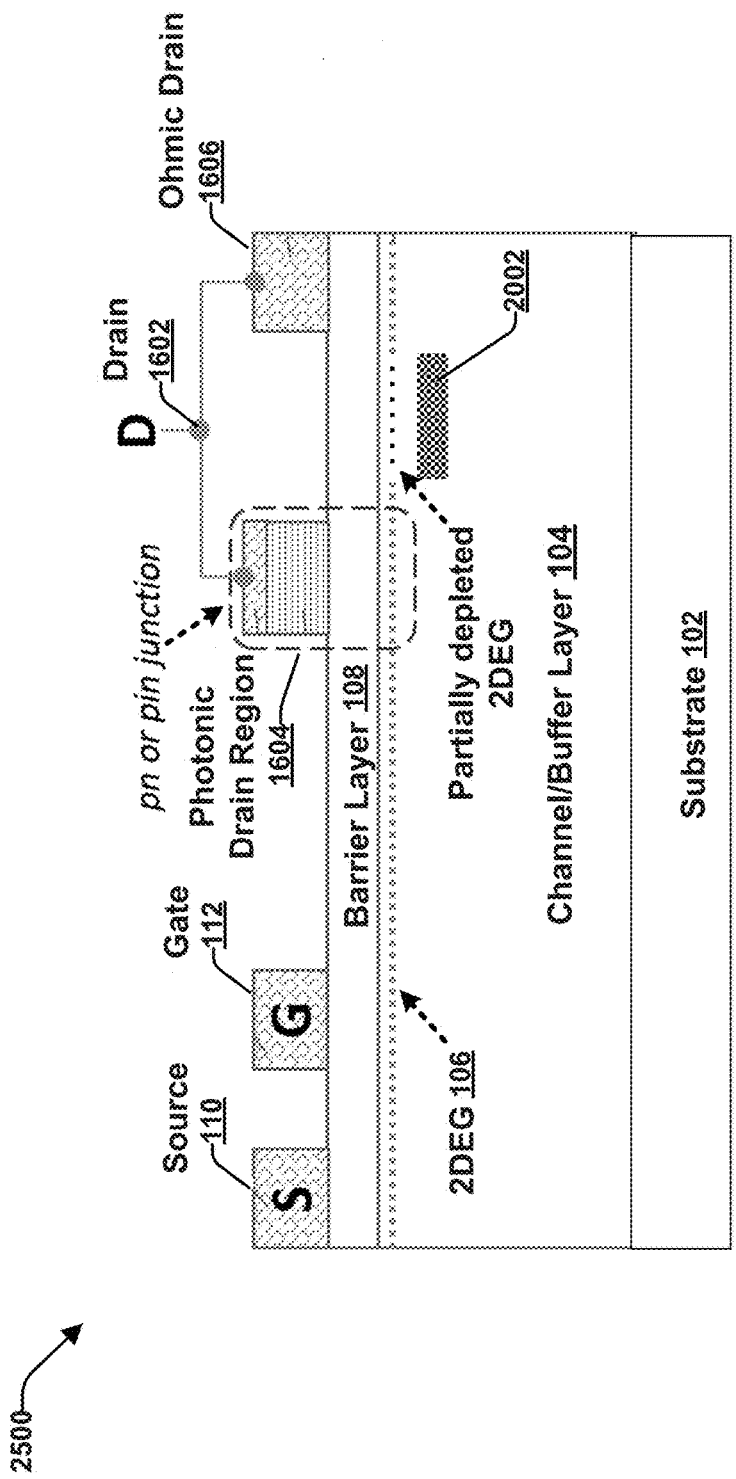
FIG. 25 presents a cross-sectional view of another example PODFET with the photonic drain formed with pn or pin junctions and the channel resistance between photonic drain and ohmic drain modulated by ion (such as fluorine) implantation in accordance with various additional aspects and embodiments described herein.

FIG. 25 presents a cross-sectional view of another example PODFET 2500 in accordance with various additional aspects and embodiments described herein. PODFET 2500 includes similar features and functionality as PODFET 2200. In accordance with this embodiment, PODFET 2500 includes a pn or pin junction for the photonic drain region 1604 and a selectively implanted region 2002 of the channel layer 104 between the photonic drain region 1604 and the ohmic drain region 1606 by ion implantation, such as fluorine ion implantation. Repetitive description of like elements employed in other embodiments described herein is omitted for sake of brevity.

Figure 26:
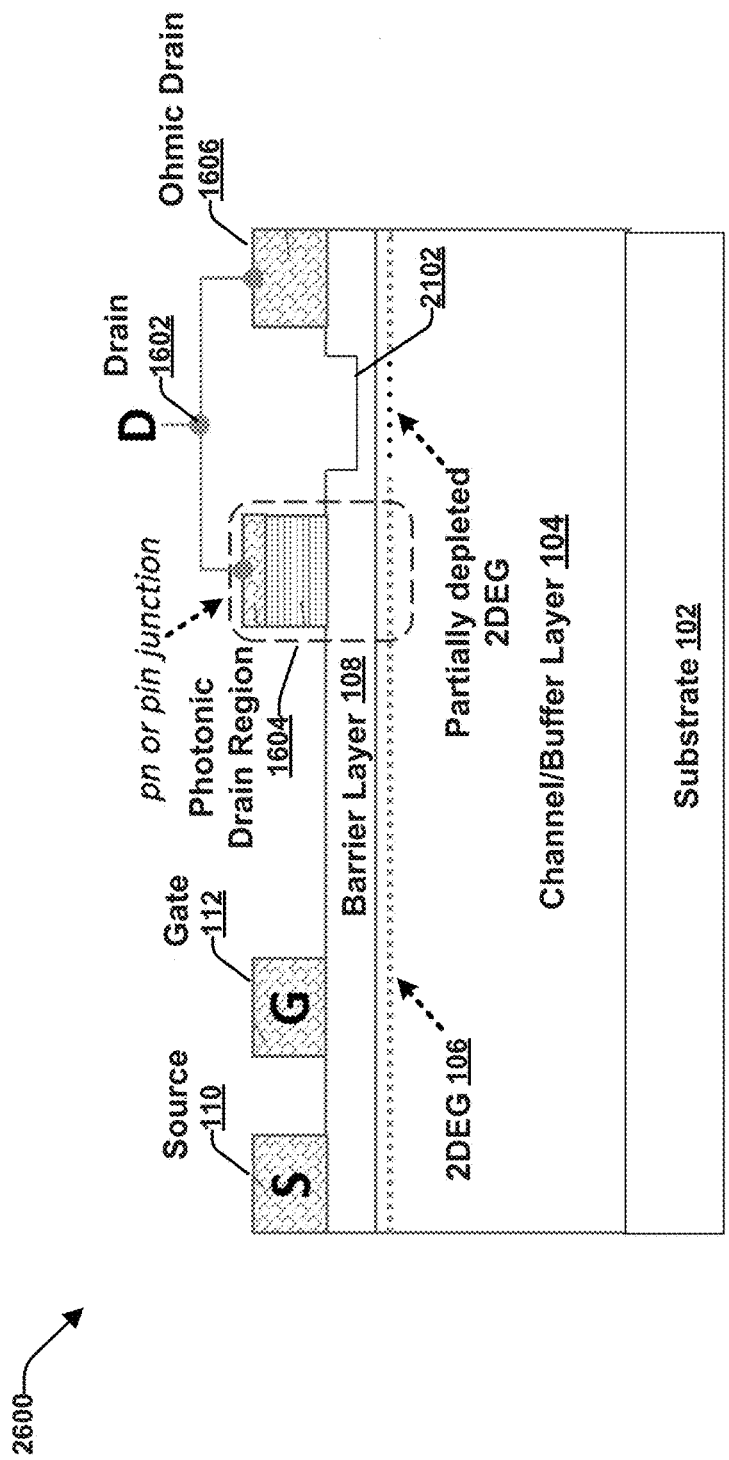
FIG. 26 presents a cross-sectional view of another example PODFET with the photonic drain formed with pn or pin junctions and the channel resistance between photonic drain and ohmic drain modulated by partial recess of barrier layer in accordance with various additional aspects and embodiments described herein.

FIG. 26 presents a cross-sectional view of another example PODFET 2600 in accordance with various additional aspects and embodiments described herein. PODFET 2600 includes similar features and functionality as PODFET 2200. In accordance with this embodiment, PODFET 2600 includes a pn or pin junction for the photonic drain region 1604 and a selectively partially recessed region 2102 of the barrier layer 108 between the photonic drain region 1604 and the ohmic drain region 1606. Repetitive description of like elements employed in other embodiments described herein is omitted for sake of brevity.

Figure 27:
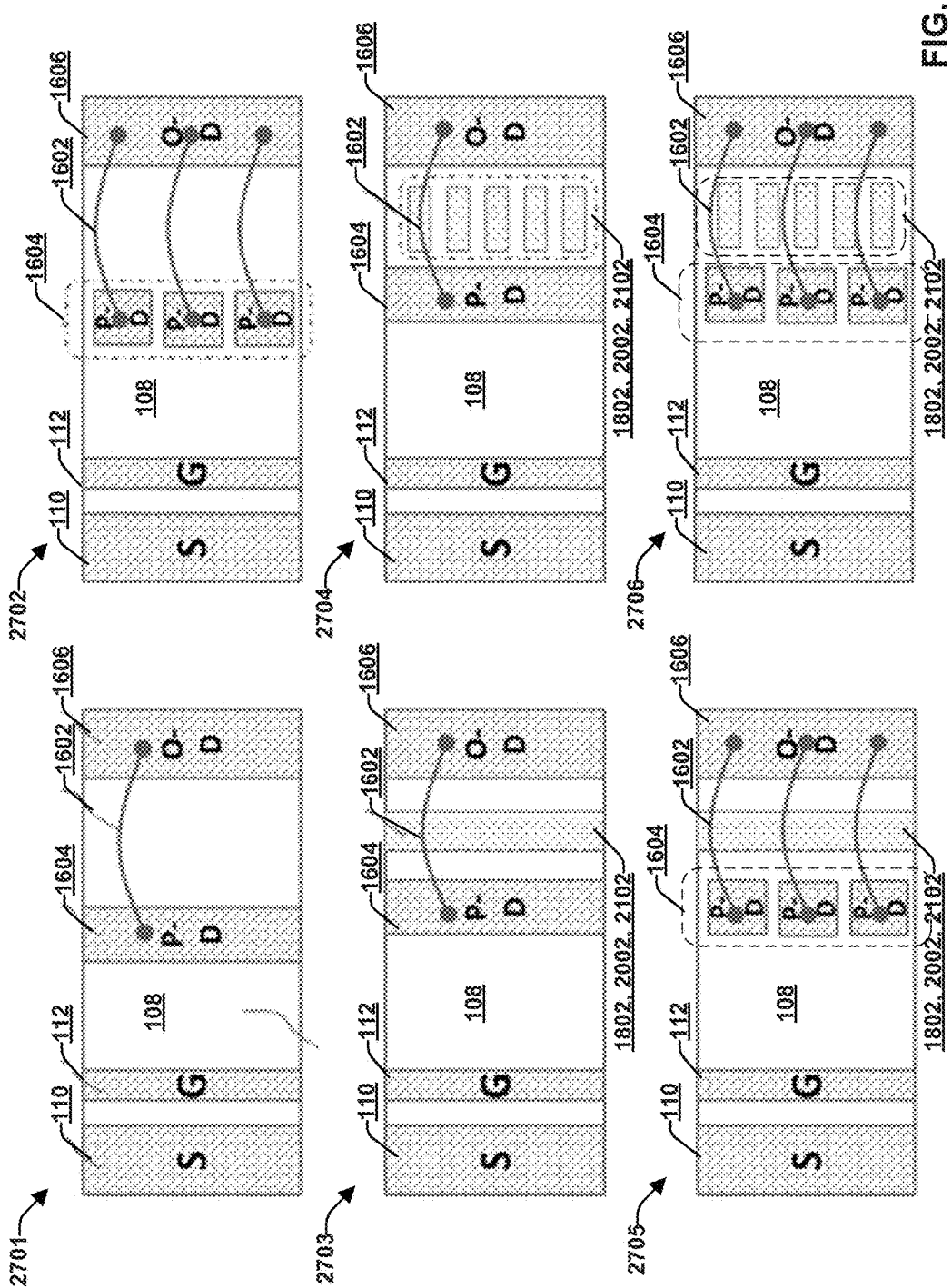
FIG. 27 shows various example top-view configurations for PODFETs in accordance with various embodiments.

FIG. 27 shows various example top-view configurations for PODFETs (e.g., PODFETs 1600, 1800, 2000, 2100, 2200, 2400, 2500, and 2600) in accordance with various embodiments. In particular, the photonic drain region, 1604 and the possible plasma treated region 1802, ion implanted region 2002, or recessed region 2102 of the subject POD-FETs can uniformly cover the channel or be formed in separated regions. The plasma treated region 1802, ion implanted region 2002, or recessed region 2102 may be covered by a drain connected field plate (not shown). Repetitive description of like elements employed in other embodiments described herein is omitted for sake of brevity.

Top view 2701 depicts an example configuration for PODFETs 1600 and 2200. With this configuration, the photonic drain region 1604 uniformly covers the channel (which includes the portion of the barrier layer 108 beneath the photonic drain region 1604 and the ohmic drain region 1606, and the portion of the barrier layer 108 between the photonic drain region 1604 and the ohmic drain region 1606). The photonic drain region 1604 can include a SoH-LED, a pn junction, or a pin junction.

Top view 2702 depicts another example configuration for PODFETs 1600 and 2200. With this configuration, the photonic drain region 1604 non-uniformly covers the channel. In particular, the photonic drain region 1604 can include two or more separated island structures or regions. For example, as depicted in view 2702, the photonic drain region 1604 includes three separated island structures. According to this embodiment, each of the two or more separated island structures of the photonic drain region 1604 can include a SoH-LED, a pn junction, or a pin junction.

Top view 2703 depicts an example configuration for PODFETs 1800, 2000, 2100, 2400, 2500 and 2600. With this configuration, the photonic drain region 1604 uniformly covers the channel and the possible plasma treated region 1802, ion implanted region 2002, or recessed region 2102 also uniformly cover the channel. The photonic drain region 1604 can include a SoH-LED, a pn junction, or a pin junction.

Top view 2704 depicts another example configuration for PODFETs 1800, 2000, 2100, 2400, 2500 and 2600. With this configuration, the photonic drain region 1604 uniformly covers the channel and the possible plasma treated region 1802, ion implanted region 2002, or recessed region 2102 non-uniformly cover the channel. In particular, the plasma treated region 1802, ion implanted region 2002, or recessed region 2102 can be formed as two or more separated structures or regions. For example, as depicted in view 2704, the plasma treated region 1802, ion implanted region 2002, or recessed region 2102 are formed in five separated regions. The photonic drain region 1604 can include a SoH-LED, a pn junction, or a pin junction.

Top view 2705 depicts another example configuration for PODFETs 1800, 2000, 2100, 2400, 2500 and 2600. With this configuration, the photonic drain region 1604 non-uniformly covers the channel and the possible plasma treated region 1802, ion implanted region 2002, or recessed region 2102 uniformly cover the channel. In particular, the photonic drain region 1604 can include two or more separated island structures or regions. For example, as depicted in view 2702, the photonic drain region 1604 includes three separated island structures. According to this embodiment, each of the two or more separated island structures of the photonic drain region 1604 can include a SoH-LED, a pn junction, or a pin junction.

Top view 2706 depicts another example configuration for PODFETs 1800, 2000, 2100, 2400, 2500 and 2600. With this configuration, the photonic drain region 1604 non-uniformly covers the channel and the possible plasma treated region 1802, ion implanted region 2002, or recessed region 2102 also non-uniformly cover the channel. In particular, the photonic drain region 1604 can include two or more separated island structures or regions. For example, as depicted in view 2706, the photonic drain region 1604 includes three separated island structures. According to this embodiment, each of the two or more separated island structures of the photonic drain region 1604 can include a SoH-LED, a pn junction, or a pin junction. In addition, the plasma treated region 1802, ion implanted region 2002, or recessed region 2102 can be formed as two or more separated structures or regions. For example, as depicted in view 2706, the plasma treated region 1802, ion implanted region 2002, or recessed region 2102 are formed in five separated regions.

Figure 28:
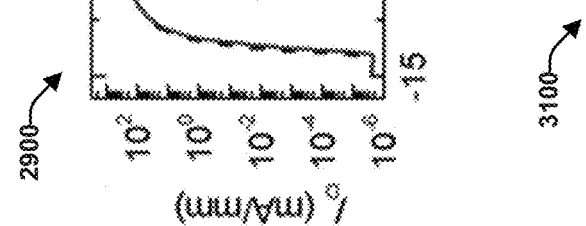

FIG. 28 presents an example PODFEFT 2800 in accordance with various aspects and embodiments described herein. PODEFT 2800 can include same or similar features and functionality as PODEFTs 1600, 2200 and the like. Repetitive description of like features employed in respective embodiments is omitted herein for sake of brevity.

PODFET 2800 includes a MIS-gate with a SoH-LED as the photonic drain 1604. The PODFET is fabricated on a AlGaN/GaN-on-Si platform, which contains a p-Si substrate (e.g., substrate 102), a transition layer formed on and adjacent to the substrate, a GaN buffer layer formed on and adjacent to the transition layer, a GaN channel layer (e.g., channel/buffer layer 104) formed on and adjacent to the buffer layer, an MN insertion layer formed on and adjacent to the channel layer, an AlGaN barrier layer (e.g., barrier layer 108) formed on and adjacent to the channel layer, and a GaN cap layer formed on and adjacent to the barrier layer. A passivation layer is further formed on and adjacent to the cap layer and includes an AlN/SiN$_x$ stack. A SiN$_x$ layer was used as the gate dielectric. Photon generation 602 from the SoH-LED during the channel ON-state has been proved by picturing the electroluminescence image using a CCD camera as shown.

Figure 29:
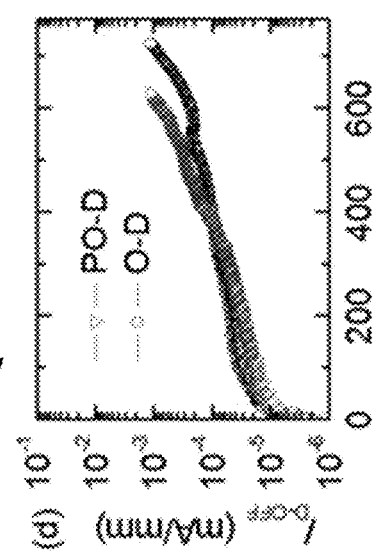
FIGS. 29-31 respectively present photograph of a demonstrating PODFET and the photon emission image, transfer curves, output curves and the OFF-state drain leakage current curves of a MIS-PODFET and a control MIS-HEMT with ohmic drain.
Figure 31:
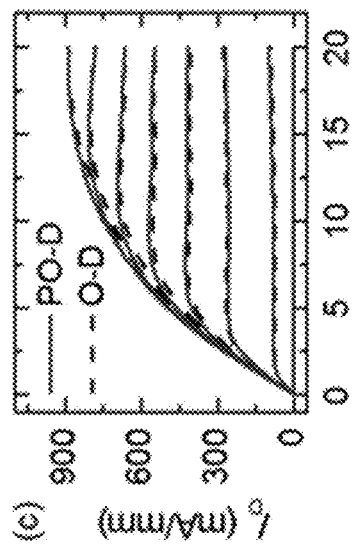
Figure 30:
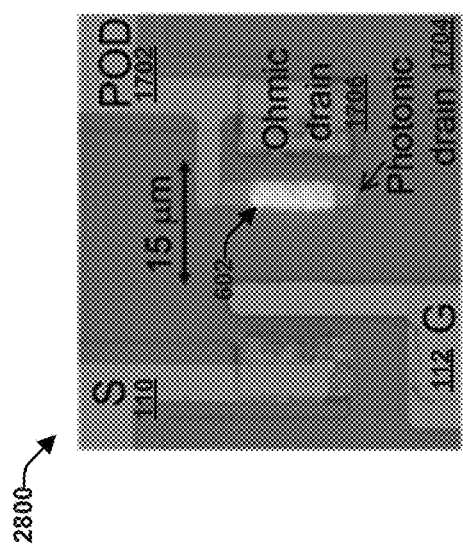

FIGS. 29-31 respectively present graphs 2900, 3000 and 3100 depicting the current-voltage characteristics of MIS-gate PODFET 2800 as well as that of a conventional MIS-HEMT with an ohmic drain. Graph 2900 depicts the transfer curves of a MIS-PODFET and a MIS-HEMT. Graph 3000 depicts the output curves of a MIS-PODFET and a MIS-HEMT. Graph 3100 depicts the OFF-state drain leakage current of a MIS-PODFET and a MIS-HEMT. As shown in graphs 2900, 3000, and 3100, the subject PODFET 2800 demonstrates no degradation in dc performance relative to that of the conventional HEMT.

FIGS. 32-33 provides graphs 3200 and 3300 depicting the measurement sequence of OFF to ON switching (soft-switching) characteristics of PODFET 2800 and a conventional HEMT with an ohmic drain to evaluate the dynamic on-resistance. The experimental results demonstrate that under dynamic switching up to 600 V, the current collapse, or the increase of on-resistance (ratio of Ron-dynamic/Ron-static) is significantly suppressed in the PODFET 2800 compared with that of a conventional HEMT as a result of photon pumping of deep traps by photons emitted from the POD drain.

Figure 34:
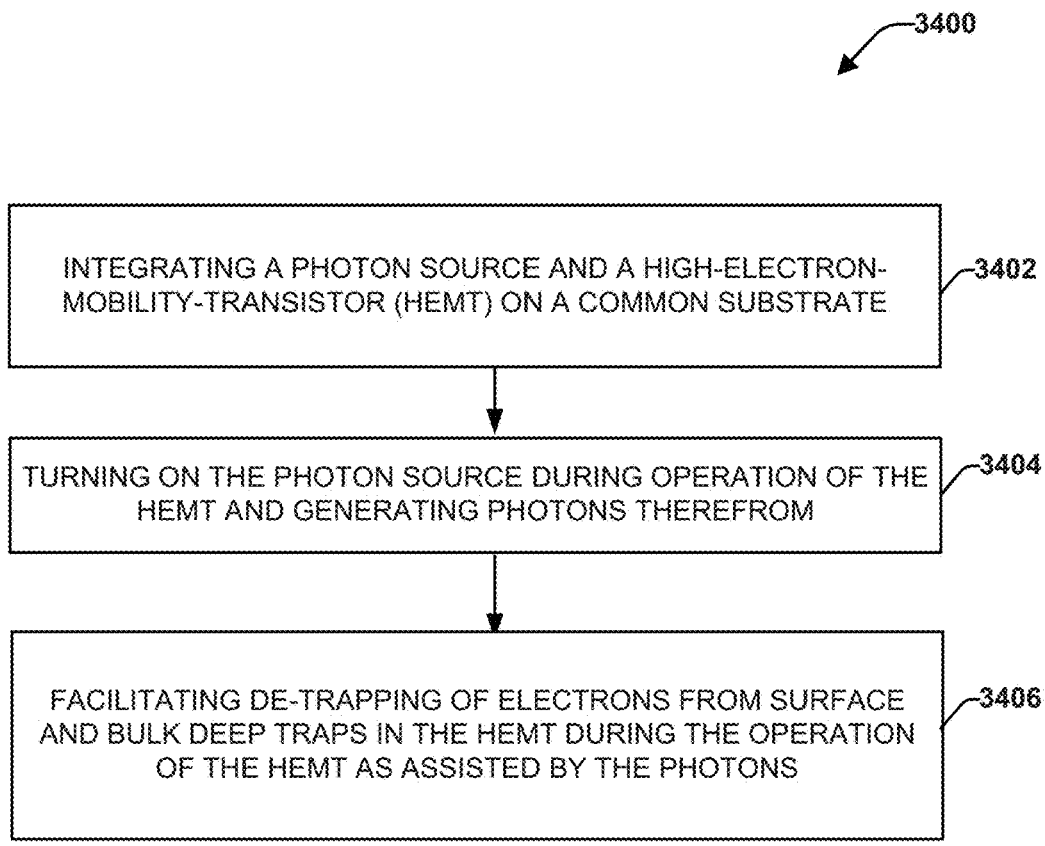
FIG. 34 presents a high level flow diagram of an example method for photon pumping of deep traps in HEMTs using an on-chip photon source in accordance with aspects and embodiments described herein.
Figure 35:
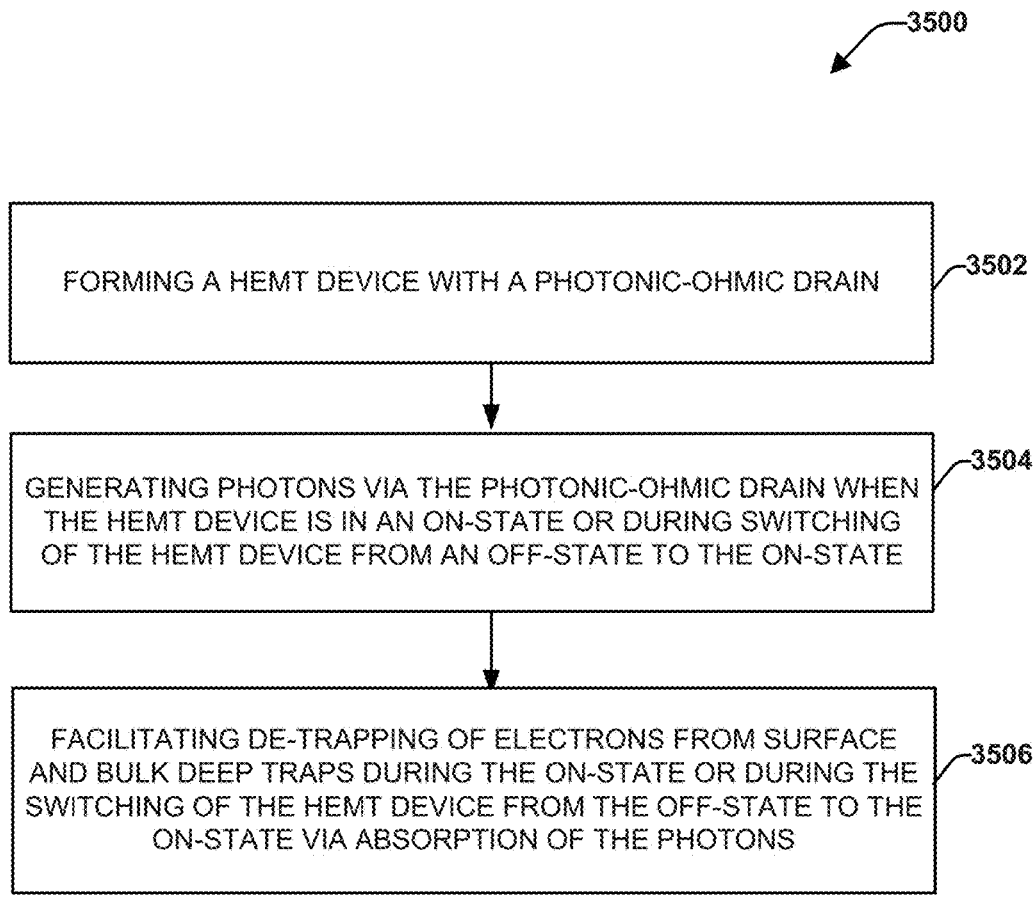
FIG. 35 presents a high level flow diagram of an example method for pumping of electrons from deep traps of HEMTs using a photonic-ohmic drain in accordance with aspects and embodiments described herein

FIGS. 34-35 illustrate methods in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 34, presented is a high level flow diagram of an example method 3400 for photon pumping of deep traps in HEMTs using an on-chip photon source in accordance with aspects and embodiments described herein. At 3402, a photon source (e.g., a SoH-LED) and a HEMT are integrated onto a common substrate. For example, a photon source can be formed on an adjacent to the drain electrode of an HEMT or the SoH-LED can be formed on a same substrate as an HEMT wherein the cathode of the SoH-LED is in connection with the source electrode of the HEMT. At 3404, the photon source is turned ON during operation of the HEMT and photons are generated therefrom. For example, the photon source can be configured to synchronously turn ON when the HEMT is switched from an OFF-state to an ON-state, thereby generating photons, when the anode of SoH-LED is connected to the gate electrode of a MIS-HEMT. At 3406, the photon source facilitates the de-trapping of electrons from a surface region and a channel/buffer region of the HEMT (e.g., bulk deep traps) during the operation of the HEMT as assisted by the photons. For example, the electrons can be trapped in the surface region and the channel/buffer region of the HEMT when a high drain bias stress or high substrate bias stress is applied to the HEMT when in the OFF-state. Photons generated by the photon source during the ON-state can be absorbed by the trapped electrons, thereby facilitating their escape from the deep traps.

FIG. 35 presents a high level flow diagram of an example method 3500 for pumping of electrons formed in deep traps of HEMTs using a photonic-ohmic drain in accordance with aspects and embodiments described herein. At 3502, a HEMT device is formed with a photonic-ohmic drain (e.g., PODFET 1600, 1800, 2000, 2100, 2200, 2400, 2500, 2600, and/or 2900). At 3504, photons are generated via the photonic-ohmic drain when the HEMT is in an ON-state or during switching of the HEMT device from an OFF-state to the ON-state. At 3506, the de-trapping of electrons from surface and bulk deep traps (e.g., a surface region and a channel/buffer region) of the HEMT is facilitated when the HEMT is in the ON-state or when the HEMT device is switched from the OFF-state to the ON-state via absorption of photons (i.e., by the electrons).

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A device, comprising:
   a high-electron-mobility-transistor (HEMT) formed on a substrate; and
   a photon source formed on the substrate configured to generate photons during operation of the HEMT,
      wherein the photon source comprises a Schottky-on-heterojunction light-emitting diode (SoH-LED), and
      wherein the photons facilitate de-trapping of electrons trapped in a surface region and a channel/buffer region of the HEMT during the operation of the HEMT.

2. The device of claim 1, wherein the electrons are trapped in the surface region and the channel/buffer region in response to drain bias stress applied to the HEMT when switched to an OFF-state.

3. The device of claim 2, wherein the photons facilitate the de-trapping of the electrons from the surface region and the channel/buffer region in response to the HEMT being switched to an ON-state from the OFF-state.

4. The device of claim 1, wherein an ON-state drain current recovery speed of the HEMT is accelerated based on the photons which cause photon pumping of deep traps during the operation of the HEMT.

5. The device of claim 1, wherein the photons facilitate the de-trapping of the electrons by photon pumping of deep traps during the operation of the HEMT and an ON-state threshold voltage of transfer curve recovery speed of the HEMT is accelerated based on the photon pumping of the deep traps during the operation of the HEMT.

6. The device of claim 1, wherein respective electrodes of the HEMT and the SoH-LED are separated.

7. The device of claim 1, wherein the HEMT comprises a gate electrode having a metal-insulator-semiconductor (MIS) structure and a source electrode, and wherein a cathode electrode of the SoH-LED is electrically connected to the source electrode of the MIS-HEMT and an anode electrode of the SoH-LED is electrically connected to the gate electrode of the MIS-HEMT.

8. The device of claim 7, wherein the HEMT is configured to drive a current to the SoH-LED in response to application of a voltage to the gate electrode, and wherein the SoH-LED is configured to generate photons in response to the voltage.

9. A method, comprising:
integrating a Schottky-on-heterojunction light-emitting diode (SoH-LED) and a high-electron-mobility-transistor (HEMT) on a common substrate;
illuminating the SoH-LED during operation of the HEMT; and
facilitating de-trapping of electrons formed in a surface region and a channel region of the HEMT during the operation of the HEMT based on the illuminating.

10. The method of claim 9, wherein the electrons are trapped in the surface region and the channel region in response to a drain bias stress of the HEMT when switched to an OFF-state, wherein the facilitating comprises switching the HEMT to an ON-state, and wherein the illuminating comprises turning on the SoH-LED concurrently with the switching of the HEMT to the ON-state.

11. The method of claim 10, further comprising:
accelerating a drain current recovery speed of the HEMT during the ON-state based on the photon pumping.

12. The method of claim 9, wherein the electrons are trapped in the channel region in response to a positive substrate bias stress of the HEMT when switched to an OFF-state, wherein the facilitating comprises switching the HEMT to an ON-state, and wherein the illuminating comprises turning on the SoH-LED concurrently with the switching of the HEMT to the ON-state.

13. The method of claim 12, further comprising:
accelerating a voltage threshold recovery speed of the HEMT during the ON-state based on the photon pumping.

14. The method of claim 1, wherein respective electrodes of the HEMT and the SoH-LED are separated.

15. The method of claim 1, wherein the HEMT comprises a gate electrode having a metal-insulator-semiconductor (MIS) structure and a source electrode, and wherein a cathode electrode of the SoH-LED is electrically connected to a source electrode of the HEMT and the anode electrode of the SoH-LED is electrically connected to a gate electrode of the HEMT.

16. The method of claim 15, further comprising:
applying a voltage to the gate electrode; and
in response to the applying, concurrently driving the operation of the HEMT and turning on the SoH-LED.

17. A photonic-ohmic drain field-effect transistor (PODFET), comprising:
a channel layer formed on and adjacent to a substrate;
a barrier layer formed on and adjacent to the channel layer;
a source electrode formed on the barrier layer;
a photonic-ohmic drain formed on the barrier layer; and
a gate electrode formed on the barrier layer between the source electrode and the photonic-ohmic drain, and wherein the photonic-ohmic drain comprises:
an ohmic drain; and
a photonic drain formed between the ohmic drain and the gate electrode, wherein the photonic drain is configured to emit photons when the PODFET is switched to an ON-state from an OFF-state.

18. The PODFET of claim 17, wherein the photonic drain comprises a structure of a Schottky-on-heterojunction light-emitting diode (SoH-LED).

19. The PODFET of claim 17, wherein the photonic drain comprises a pn-junction or a pin-junction.

20. The PODFET of claim 17, wherein the photonic drain comprises an anode portion and a cathode portion, and wherein the photonic drain is configured to generate the photons in response to establishment of an effective bias across the anode portion and the cathode portion generated based on a current established in the active channel during the ON-state.

21. The PODFET of claim 17, wherein an amount of the photons generated from the photonic drain is based on a drain voltage, and wherein a level of the drain voltage for photon generation by the photonic drain is reduced as a level of resistance of an access region formed between the photonic drain and the ohmic drain is increased.

22. The PODFET of claim 17, wherein an amount of the photons generated from the photonic drain region is based on a channel current of the PODFET, and wherein a level of the channel current required for photon generation by the photonic drain is reduced as a level of resistance of an access region formed between the photonic drain and the ohmic drain is increased.

23. The PODFET of claim 17, further comprising:
an access region located between the photonic drain and the ohmic drain and formed within a first portion of a least one of the channel layer or the barrier layer.

24. The PODFET of claim 23, wherein the access region has a higher level of resistance than a second portion of the channel layer or the barrier layer based on the access region comprising implanted ions.

25. The PODFET of claim 17, further comprising:
a recessed access region formed between the photonic drain and the ohmic drain.

26. The PODFET of claim 23, wherein the access region has a higher level of resistance than a second portion of the channel layer or the barrier layer based on treatment of the access region with fluorine plasma.

27. The PODFET of claim 23, wherein an amount of the photons generated from the photonic drain region is based on a resistance level of the access region.

28. The PODFET of claim 17, further comprising:
an active channel formed at an interface between the channel layer and the barrier layer, and wherein the ohmic drain is electrically coupled to the active channel.

* * * * *